(12) United States Patent
Kamimura

(10) Patent No.: US 12,448,541 B2
(45) Date of Patent: Oct. 21, 2025

(54) POLISHING LIQUID AND CHEMICAL MECHANICAL POLISHING METHOD

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 284 days.

(21) Appl. No.: 17/542,486

(22) Filed: Dec. 5, 2021

(65) Prior Publication Data

US 2022/0089909 A1    Mar. 24, 2022

Related U.S. Application Data

(63) Continuation of application No. PCT/JP2020/018765, filed on May 11, 2020.

(30) Foreign Application Priority Data

Jun. 20, 2019  (JP) .................................. 2019-114674

(51) Int. Cl.
  C09G 1/02 (2006.01)
  H01L 21/321 (2006.01)
(52) U.S. Cl.
  CPC ............ C09G 1/02 (2013.01); H01L 21/3212 (2013.01)
(58) Field of Classification Search
  None
  See application file for complete search history.

(56) References Cited

U.S. PATENT DOCUMENTS

| | | |
|---|---|---|
| 8,083,964 B2 | 12/2011 | Yamada et al. |
| 10,059,860 B2 | 8/2018 | Yasui |
| 10,283,373 B2 | 5/2019 | Sakashita et al. |
| 2008/0242091 A1 | 10/2008 | Kato et al. |
| 2009/0087989 A1* | 4/2009 | Kamimura ............... C09G 1/02 438/693 |
| 2017/0009101 A1 | 1/2017 | Yasui |

(Continued)

FOREIGN PATENT DOCUMENTS

| | | |
|---|---|---|
| CN | 103897602 | 7/2014 |
| JP | 2004273650 | 9/2004 |

(Continued)

OTHER PUBLICATIONS

Chemical Book; physical properties of 1-Hydroxybenzotriazole; Source: Google; (Year: 2024).*

(Continued)

*Primary Examiner* — Shamim Ahmed
(74) *Attorney, Agent, or Firm* — JCIPRNET

(57) ABSTRACT

A polishing liquid which reduces the occurrence of erosion and scratches on a surface to be polished of an object to be polished having a cobalt-containing film after polishing in a case where the polishing liquid is applied to CMP of the object to be polished is provided. In addition, a chemical mechanical polishing method using the above-mentioned polishing liquid is provided. The polishing liquid is a polishing liquid used for chemical mechanical polishing of an object to be polished having a cobalt-containing film. The polishing liquid includes colloidal silica, an organic acid, a specific nitrogen-containing aromatic heterocyclic compound and hydrogen peroxide, and has a pH of 8.5 to 12.

21 Claims, 1 Drawing Sheet

(56) References Cited

U.S. PATENT DOCUMENTS

| | | | | |
|---|---|---|---|---|
| 2017/0330762 A1* | 11/2017 | Kamei | .............. | H01L 21/3212 |
| 2018/0226267 A1* | 8/2018 | Hayama | ............ | H01L 21/31133 |
| 2018/0340094 A1* | 11/2018 | Liang | ................. | H01L 21/3212 |
| 2019/0022821 A1* | 1/2019 | Tabata | .................. | B24B 37/00 |
| 2019/0119523 A1* | 4/2019 | Tamada | ................ | B24B 1/005 |

FOREIGN PATENT DOCUMENTS

| | | |
|---|---|---|
| JP | 2005223260 | 8/2005 |
| JP | 2008251677 | 10/2008 |
| JP | 2008277723 | 11/2008 |
| JP | 2009064881 | 3/2009 |
| JP | 2018107294 | 7/2018 |
| JP | 2018157164 | 10/2018 |
| KR | 20160125957 | 11/2016 |
| TW | 201420739 | 6/2014 |
| TW | 201540817 | 11/2015 |
| WO | 2014045937 | 3/2014 |
| WO | 2015129342 | 9/2015 |
| WO | 2016006631 | 1/2016 |
| WO | 2018159530 | 9/2018 |
| WO | 2018217628 | 11/2018 |

OTHER PUBLICATIONS

"International Search Report (Form PCT/ISA/210) of PCT/JP2020/018765," mailed on Jul. 21, 2020, with English translation thereof, pp. 1-7.

"Written Opinion of the International Searching Authority (Form PCT/ISA/237)" of PCT/JP2020/018765, mailed on Jul. 21, 2020, with English translation thereof, pp. 1-9.

"Office Action of Japan Counterpart Application" with English translation thereof, issued on Dec. 6, 2022, p. 1-p. 12.

"Office Action of Taiwan Counterpart Application", issued on Nov. 3, 2023, with English translation thereof, p. 1-p. 14.

Office Action of Japan Counterpart Application, with English translation thereof, issued on Feb. 21, 2023, pp. 1-8.

"Office Action of Korean Counterpart Application", issued on Feb. 13, 2024, with English translation thereof, p. 1-p. 10.

\* cited by examiner

POLISHING LIQUID AND CHEMICAL MECHANICAL POLISHING METHOD

CROSS-REFERENCE TO RELATED APPLICATIONS

This application is a Continuation of PCT International Application No. PCT/JP2020/018765 filed on May 11, 2020, which claims priority under 35 U.S.C. § 119(a) to Japanese Patent Application No. 2019-114674 filed on Jun. 20, 2019. The above application is hereby expressly incorporated by reference, in its entirety, into the present application.

BACKGROUND OF THE INVENTION

1. Field of the Invention

The present invention relates to a polishing liquid and a chemical mechanical polishing method.

2. Description of the Related Art

In the manufacture of a semiconductor integrated circuit (large-scale integrated circuit: LSI), a chemical mechanical polishing (CMP) method is used for flattening a bare wafer, flattening an interlayer insulating film, forming a metal plug, forming an embedded wiring line, and the like.

By the way, cobalt has recently been attracting attention as a wiring line metal element instead of copper due to a demand for miniaturization of a wiring line. In a case where cobalt is used as the wiring line metal element, it is necessary to use a polishing liquid for CMP, which can remove cobalt.

For example, WO2016/006631A discloses "a polishing liquid for CMP used for polishing a surface to be polished, having at least a cobalt-containing part and a metal-containing part that contains a metal other than cobalt, the polishing liquid comprising polishing particles, a metal corrosion inhibitor and water, in which a pH is 4.0 or less, and in a case where a corrosion potential EA of cobalt and a corrosion potential EB of the metal are measured in the polishing liquid for CMP, an absolute value of a corrosion potential difference between the corrosion potential EA and the corrosion potential EB, that is, the potential difference EA−EB, is 0 to 300 mV".

SUMMARY OF THE INVENTION

The present inventors have examined the polishing liquid for CMP described in WO2016/006631A, and have thus found that there is room for an improvement in erosion (phenomenon in which a part other than a wiring line is partially significantly scraped in a case where the wiring line is formed by CMP) and scratches (phenomenon in which scratch-like defects are generated on a surface to be polished by polishing in a case where a wiring line is formed by CMP), which are generated on a surface to be polished of an object to be polished after polishing.

Therefore, an object of the present invention is to provide a polishing liquid which reduces the occurrence of erosion and scratches on a surface to be polished of an object to be polished having a cobalt-containing film after polishing in a case where the polishing liquid is applied to CMP of the object to be polished.

In addition, another object of the present invention is to provide a chemical mechanical polishing method using the polishing liquid.

The present inventors have found that the objects can be accomplished by the following configurations.

[1] A polishing liquid used for chemical mechanical polishing of an object to be polished having a cobalt-containing film, the polishing liquid comprising:
colloidal silica;
an organic acid;
a nitrogen-containing aromatic heterocyclic compound which is one or more selected from the group consisting of a compound represented by General Formula (I) which will be described later, a compound represented by General Formula (II) which will be described later, a compound represented by General Formula (III) which will be described later, a compound represented by General Formula (IV) which will be described later, and a compound represented by General Formula (V) which will be described later, and has a C log P value of less than 1.0; and
hydrogen peroxide,
in which a pH is 8.5 to 12.0.

[2] The polishing liquid as described in [1],
in which a pH of the polishing liquid is more than 9.0 and less than 12.0.

[3] The polishing liquid as described in [1] or [2], further comprising a surfactant.

[4] The polishing liquid as described in [3],
in which the surfactant includes an anionic surfactant.

[5] The polishing liquid as described in [4],
in which a value of a difference obtained by subtracting a C log P value of the nitrogen-containing aromatic heterocyclic compound from a C log P value of the anionic surfactant is more than 4.0.

[6] The polishing liquid as described in any one of [3] to [5],
in which the surfactant includes a nonionic surfactant.

[7] The polishing liquid as described in any one of [3] to [6],
in which the surfactant includes a nonionic surfactant having an HLB value of 8 to 17.

[8] The polishing liquid as described in any one of [1] to [7], in which the organic acid is polycarboxylic acid.

[9] The polishing liquid as described in any one of [1] to [8],
in which a content of the colloidal silica is 20.0% by mass or less with respect to a total mass of the polishing liquid, and
an average primary particle diameter of the colloidal silica is 60 nm or less.

[10] The polishing liquid as described in any one of [1] to [9], further comprising sodium and potassium,
in which a mass ratio of a content of potassium to a content of sodium is $1.0 \times 10^6$ to $1.0 \times 10^{12}$.

[11] The polishing liquid as described in any one of [1] to [10],
in which a concentration of solid contents is 10% by mass or more, and
the polishing liquid is used after 2-times or more dilution on a mass basis.

[12] A chemical mechanical polishing method comprising:
a step of obtaining an object to be polished, which has been polished, by bringing a surface to be polished of an object to be polished into contact with a polishing pad attached to a polishing platen while supplying the polishing liquid as described in any one of [1] to [10]

to the polishing pad, and relatively moving the object to be polished and the polishing pad to polish the surface to be polished.

[13] The chemical mechanical polishing method as described in [12], in which a polishing pressure is 0.5 to 3.0 psi.

[14] The chemical mechanical polishing method as described in [12] or [13], in which a supply rate of the polishing liquid supplied to the polishing pad is 0.14 to 0.35 ml/(min·cm$^2$).

[15] The chemical mechanical polishing method as described in any one of [12] to [14], in which the object to be polished has at least a first layer containing cobalt and a second layer other than the first layer, and a polishing speed of the first layer is more than 0.05 and less than 5 with respect to a polishing speed of the second layer under the same polishing conditions.

[16] The chemical mechanical polishing method as described in [15], in which the second layer includes one or more materials selected from the group consisting of tantalum, tantalum nitride, titanium nitride, silicon nitride, tetraethoxysilane, silicon oxycarbide, and silicon carbide.

[17] The chemical mechanical polishing method as described in any one of [12] to [16], further comprising a step of cleaning the object to be polished, which has been polished, with an alkaline cleaning liquid after the step of obtaining the object to be polished, which has been polished.

[18] A polishing liquid used for chemical mechanical polishing of an object to be polished, the polishing liquid comprising:

abrasive grains;

an organic acid;

a nitrogen-containing aromatic heterocyclic compound which is one or more selected from the group consisting of a compound represented by General Formula (I) which will be described later, a compound represented by General Formula (II) which will be described later, a compound represented by General Formula (III) which will be described later, a compound represented by General Formula (IV) which will be described later, and a compound represented by General Formula (V) which will be described later, and has a C log P value of less than 1.0; and hydrogen peroxide, a pH is 8.5 to 12.0.

According to the present invention, it is possible to provide a polishing liquid which reduces the occurrence of erosion and scratches on a surface to be polished of an object to be polished having a cobalt-containing film after polishing in a case where the polishing liquid is applied to CMP of the object to be polished.

In addition, it is also possible to provide a chemical mechanical polishing method using the polishing liquid.

DESCRIPTION OF THE PREFERRED EMBODIMENTS

Figure 1:
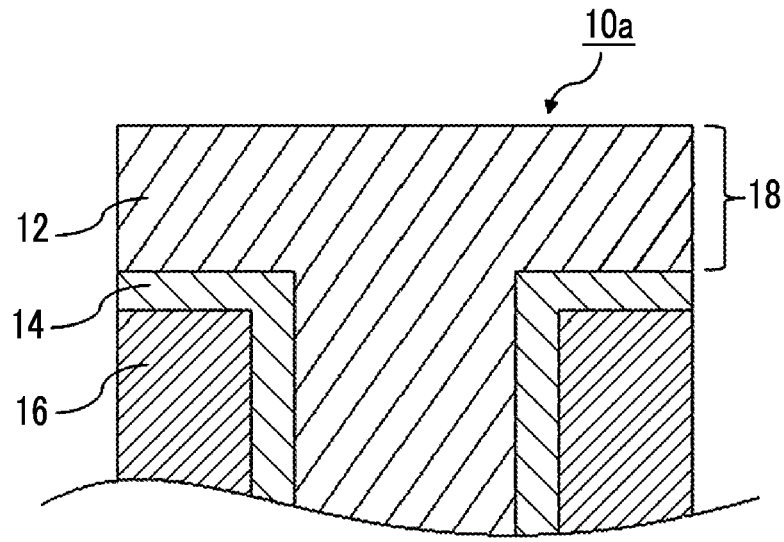
FIG. 1 is a schematic view showing an example of an object to be pretreated, which is subjected to a pretreatment for obtaining an object to be polished for which a chemical mechanical polishing method is carried out.

Hereinafter, the present invention will be described in detail.

Descriptions on the configuration requirements which will be described later are made based on representative embodiments of the present invention in some cases, but it should not be construed that the present invention is limited to such embodiments.

In addition, in the present specification, a numerical value range expressed using "to" means a range that includes the preceding and succeeding numerical values of "to" as the lower limit value and the upper limit value, respectively.

Incidentally, in the present invention, "ppm" means "parts-per-million ($10^{-6}$)", "ppb" means "parts-per-billion ($10^{-9}$)", and "ppt" means "parts-per-trillion ($10^{-12}$)".

In the present specification, the C log P value is a value determined by calculation of a common logarithm log P of a partition coefficient P between 1-octanol and water. With regard to a method or software used for calculation of the C log P value, a known method or software can be used, but in the present specification, a C log P program incorporated into ChemBioDraw Ultra 12.0 from Cambridge Soft is used unless otherwise specified.

In the present specification, the pH can be measured by a pH meter, and a measurement temperature is 25° C. Incidentally, a product name, "LAQUA Series" (manufactured by HORIBA, Ltd.), can be used for the pH meter.

In the present specification, psi means a pound-force per square inch; 1 psi=6,894.76 Pa.

In a case where the contents of potassium and sodium are mentioned in the present specification, the respective contents are intended to be the contents based on the mass of each metal atom.

[Polishing Liquid]

The polishing liquid of an embodiment of the present invention (hereinafter also referred to as "the present polishing liquid") is a polishing liquid used for chemical mechanical polishing (CMP) of an object to be polished (preferably an object to be polished having a cobalt-containing film), the polishing liquid including abrasive grains (preferably colloidal silica); an organic acid; a specific nitrogen-containing aromatic heterocyclic compound; and hydrogen peroxide, in which a pH is 8.5 to 12.

Hereinafter, with regard to the polishing liquid, satisfaction of at least one of performance of reducing the occurrence of erosion on a surface to be polished of an object to be polished after polishing (also simply referred to as "an erosion suppressing property") or performance of reducing the occurrence of scratches on a surface of the object to be polished of an object to be polished after polishing (also simply referred to as "a scratch suppressing property") is also expressed as follows: the effect of the present invention is more excellent.

[Components]

Hereinafter, components that are included in the present polishing liquid and components that can be included in the present polishing liquid will be described.

In addition, each component which will be described below may be ionized in the present polishing liquid. The content of each component in the following description is obtained by converting the component which is present in the state of being ionized in the present polishing liquid is intended to mean a content on the assumption that the component is not ionized.

For example, in a case where a compound (ion) in which a carboxylic acid group (—COOH) serves as a carboxylate anion (—COO⁻) is included in the present polishing liquid, the present polishing liquid is considered to include a compound having the carboxylic acid group.

<Colloidal Silica (Abrasive Grains)>

The present polishing liquid includes colloidal silica (silica colloidal particles). The colloidal silica functions as abrasive grains for polishing an object to be polished.

In another aspect of the present invention, the present polishing liquid includes abrasive grains. Examples of the abrasive grains include inorganic abrasive grains such as silica, alumina, zirconia, ceria, titania, germania, and silicon carbide; and organic abrasive grains such as polystyrene, polyacryl, and polyvinyl chloride. Among those, the silica particles are preferable as the abrasive grains from the viewpoint that the dispersion stability in the polishing liquid is excellent and the number of scratches (polishing flaws) generated by CMP is small.

The silica particles are not particularly limited, and examples thereof include precipitated silica, fumed silica, and colloidal silica. Among those, the colloidal silica is more preferable.

The present polishing liquid is preferably a slurry.

An average primary particle diameter of the colloidal silica is preferably 60 nm or less, and more preferably 30 nm or less from the viewpoint that generation of defects on a surface to be polished can be further suppressed.

The lower limit value of the average primary particle diameter of the colloidal silica is preferably 1 nm or more, and more preferably 3 nm or more from the viewpoint that the aggregation of the colloidal silica is suppressed and the temporal stability of the present polishing liquid is thus improved.

An average primary particle diameter is obtained by measuring particle diameters (equivalent circle diameters) of any 1,000 primary particles selected from an image captured using a transmission electron microscope TEM2010 (pressurization voltage: 200 kV) manufactured by JEOL Ltd., and arithmetically averaging the values. Incidentally, the equivalent circle diameter is a diameter of a circle assuming a true circle having the same projected area as a projected area of a particle at the time of observation.

It should be noted that in a case where a commercially available product is used as the colloidal silica, a catalog value is preferentially adopted as the average primary particle diameter of the colloidal silica.

An average aspect ratio of the colloidal silica is preferably 1.5 to 2.0, more preferably 1.55 to 1.95, and still more preferably 1.6 to 1.9 from the viewpoint where a polishing power is improved.

The average aspect ratio of the colloidal silica is obtained by measuring a major diameter and a minor diameter for every arbitrary 100 particles observed with the above-mentioned transmission electron microscope to calculate aspect ratios (major diameter/minor diameter) of the respective particles, and arithmetically averaging the aspect ratios of the 100 particles. Incidentally, the major diameter of a particle means a length of the particle in a major axis direction, and the minor diameter of a particle means a length of the particle in a direction orthogonal to the major axis direction of the particle.

It should be noted that in a case where a commercially available product is used as the colloidal silica, a catalog value is preferentially adopted as the average aspect ratio of the colloidal silica.

A degree of association of the colloidal silica is preferably 1 to 3 from the viewpoint that the polishing speed is further increased.

In the present specification, the degree of association is determined by an equation: Degree of association=Average secondary particle diameter/Average primary particle diameter. An average secondary particle diameter corresponds to an average particle diameter (equivalent circle diameter) of secondary particles in an aggregated state, and can be determined by the same method as for the average primary particle diameter.

It should be noted that in a case where a commercially available product is used as the colloidal silica, a catalog value is preferentially adopted as the degree of association of the colloidal silica.

The colloidal silica may have a surface modifying group (a sulfonic acid group, a phosphonic acid group, and/or a carboxylic acid group, and the like) on the surface.

Incidentally, the group may be ionized in the polishing liquid.

A method for obtaining colloidal silica having a surface modifying group is not particularly limited, and examples thereof include the method described in JP2010-269985A.

As the colloidal silica, a commercially available product may be used, and examples thereof include PL1, PL3, PL7, PL10H, PL1D, PL07D, PL2D, and PL3D (all of which are product names, manufactured by Fuso Chemical Co., Ltd.).

The upper limit value of the content of the colloidal silica is preferably 20.0% by mass or less, more preferably 10.0% by mass or less, and still more preferably 5.0% by mass or less with respect to the total mass (100% by mass) of the present polishing liquid from the viewpoint that the effect of the present invention is more excellent. The lower limit value is preferably 1.0% by mass or more, and more preferably 2.0% by mass or more.

The colloidal silica may be used alone or in combination of two or more kinds thereof. In a case where two or more kinds of the colloidal silica are used, a total content thereof is preferably within the range.

A suitable range of the content of the abrasive grains in the polishing liquid is the same as the suitable range of the content of the colloidal silica described above.

<Organic Acid>

The present polishing liquid includes an organic acid.

The organic acid is preferably a compound different from a surfactant (particularly an anionic surfactant).

Examples of the organic acid included in the present polishing liquid include one or more organic acids selected from the group consisting of glycine, α-alanine (2-aminopropionic acid), β-alanine β-aminopropionic acid), sarcosine, iminodiacetic acid, polycarboxylic acid, and polyphosphonic acid, and from the viewpoint that the effect of the present invention is more excellent, one or more organic acids selected from the group consisting of the polycarboxylic acid and the polyphosphonic acid are preferable, and the polycarboxylic acid is more preferable.

The polycarboxylic acid is a compound having two or more carboxylic acid groups in one molecule, and the polyphosphonic acid is a compound having two or more phosphonic acid groups in one molecule.

Examples of the polycarboxylic acid include citric acid, malonic acid, maleic acid, and succinic acid.

Examples of the polyphosphonic acid include 1-hydroxyethane-1,1-diphosphonic acid and ethylenediaminetetramethylenephosphonic acid.

The organic acids may be used alone or in combination of two or more kinds thereof.

Examples of a combination of two or more kinds of the organic acids include a combination of citric acid and malonic acid, and a combination of malonic acid and ethylenediaminetetramethylenephosphonic acid.

In a case where two or more kinds of the organic acids are used, a mass ratio (content of the organic acid with the second highest content/content of the organic acid with the highest content) of an content of the organic acid with the second highest content to a content of the organic acid with the highest content is preferably 0.1 to 1.0, and more preferably 0.2 to 1.0. Incidentally, the content of the organic acid with the highest content may be substantially the same as the content of the organic acid with the second highest content.

The content of the organic acid is preferably 0.001% to 5% by mass, and more preferably 0.1% to 1.5% by mass with respect to a total mass of the present polishing liquid.

In a case where two or more kinds of the organic acids are used, a total content thereof is preferably within the range.

<Nitrogen-Containing Aromatic Heterocyclic Compound>

The present polishing liquid includes a nitrogen-containing aromatic heterocyclic compound (hereinafter also referred to as a "specific compound") which is one or more selected from the group consisting of a compound represented by General Formula (I), a compound represented by General Formula (II), a compound represented by General Formula (III), a compound represented by General Formula (IV), and a compound represented by General Formula (V), and has a C log P value of less than 1.0.

The nitrogen-containing aromatic heterocyclic compound is a compound having a heterocyclic structure having aromaticity in the molecule.

Hereinafter, the specific compound will be described.
(C log P Value)

A C log P value of the specific compound used in the present polishing liquid is less than 1.0.

The lower limit of the C log P value is not particularly limited, but is preferably −5.0 or more, and more preferably −4.0 or more.

Hereinafter, the specific compound will be described for each of General Formulae (I) to (V).
(Compound Represented by General Formula (I))

(I)

in General Formula (I), $R^{11}$ and $R^{12}$ each independently represent a hydrogen atom, a hydrophilic group, or a hydrocarbon group having a hydrophilic group. In addition, $R^{11}$ and $R^{12}$ may be bonded to each other to form a ring.

In General Formula (I), examples of the hydrophilic group represented by each of $R^{11}$ and $R^{12}$ include a hydroxy group, a mercapto group, a carboxyl group, an amino group, an amide group, a nitro group, a sulfo group, a phosphoric acid group, and a group that is a salt thereof. Among those, the carboxyl group or the amino group is preferable.

In General Formula (I), examples of the hydrocarbon group represented by each of $R^{11}$ and $R^{12}$ include an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 18 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

The hydrocarbon group represented by each of $R^{11}$ and $R^{12}$ has a hydrophilic group. The hydrophilic group contained in the hydrocarbon group represented by each of $R^{11}$ and $R^{12}$ has the same definition as the hydrophilic group represented by each of $R^{11}$ and $R^{12}$ described above, and a suitable aspect thereof is also the same.

In addition, the hydrocarbon group represented by each of $R^{11}$ and $R^{12}$ may have a substituent other than the hydrophilic group. Examples of the substituent include an alkyl group (preferably having 1 to 12 carbon atoms, more preferably having 1 to 6 carbon atoms, and still more preferably having 1 to 3 carbon atoms), an aryl group (preferably having 6 to 18 carbon atoms, more preferably having 6 to 14 carbon atoms, and still more preferably having 6 to 10 carbon atoms), and —N($R_a$)($R_b$). $R_a$ and $R_b$ each independently represent a hydrogen atom or an organic group. It should be noted that at least one of $R_a$ or $R_b$ is the organic group. As the organic group, an alkyl group (for example, an alkyl group 1 to 12 carbon atoms, preferably having 1 to 6 carbon atoms, and more preferably having 1 to 4 carbon atoms) is preferable.

The ring formed by bonding $R^{11}$ and $R^{12}$ to each other is not particularly limited, but is preferably an aromatic ring (which may be either a monocyclic ring or a polycyclic ring), and more preferably a benzene ring. Further, the ring formed by bonding $R^{11}$ and $R^{12}$ to each other may have a substituent. The substituent is not particularly limited, but examples thereof include a hydrophilic group or those exemplified as the substituent contained in the hydrocarbon group represented by each of $R^{11}$ and $R^{12}$. As the substituent contained in the ring formed by bonding $R^{11}$ and $R^{12}$ to each other, a carboxyl group and a nitro group are preferable.

The compound represented by General Formula (I) preferably has a benzotriazole skeleton having a structure in which $R^{11}$ and $R^{12}$ are bonded to each other to form a benzene ring, and more preferably has a benzotriazole skeleton having a substituent on a benzene ring, which is formed by bonding $R^{11}$ and $R^{12}$.

Examples of the compound having a benzotriazole skeleton and having a C log P value of less than 1.0 include 5-carboxybenzotriazole and 5-nitrobenzotriazole.

Furthermore, in the present specification, the compound represented by General Formula (I) shall include a tautomer thereof.
(Compound Represented by General Formula (II))

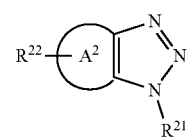

(II)

In General Formula (II), a ring $A^2$ represents a benzene ring or a 6-membered aromatic heterocycle. $R^{21}$ represents a hydrophilic group or a hydrocarbon group having a hydrophilic group. $R^{22}$ represents a hydrogen atom, a hydrophilic group, or a hydrocarbon group having a hydrophilic group.

In General Formula (II), the 6-membered aromatic heterocycle represented by the ring $A^2$ preferably includes a nitrogen atom as an atom constituting the ring.

The 6-membered aromatic heterocycle including a nitrogen atom includes a pyridine ring including one nitrogen atom, a pyridazine ring including two nitrogen atoms located at the ortho position, a pyrimidine ring including two nitrogen atoms located at the meta positions, and a pyrazine ring including two nitrogen atoms located at the para positions.

As the ring $A^2$, the benzene ring or the pyridine ring is preferable, and the benzene ring is more preferable.

In General Formula (II), the hydrophilic group and the hydrocarbon group having a hydrophilic group represented by each of $R^{21}$ and $R^{22}$ have the same definitions as the hydrophilic group rand the hydrocarbon group having a hydrophilic group represented by each of $R^{11}$ and $R^{12}$, respectively.

As $R^{21}$, a hydrophilic group or an alkyl group having a hydrophilic group and having 1 to 6 carbon atoms is preferable, and a hydroxy group, a carboxyl group, or an amino group, an alkyl group having a hydroxy group, a carboxyl group, or an amino group having 1 to 3 carbon atoms is more preferable, and the hydroxy group or a hydroxymethyl group is still more preferable.

As $R^{22}$, a hydrogen atom or a hydrophilic group is preferable, the hydrogen atom, a hydroxyl group, a carboxyl group, or a nitro group is more preferable, and the hydrogen atom is still more preferable.

(Compound Represented by General Formula (III))

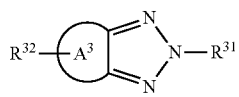

(III)

In General Formula (III), a ring $A^3$ represents a benzene ring or a 6-membered aromatic heterocycle. $R^{31}$ represents a hydrophilic group or a hydrocarbon group having a hydrophilic group. $R^{32}$ represents a hydrogen atom, a hydrophilic group, or a hydrocarbon group having a hydrophilic group.

The ring $A^3$ in General Formula (III) has the same definition as the ring $A^2$ in General Formula (II), and a suitable aspect thereof is also the same.

In addition, $R^{31}$ and $R^{32}$ in General Formula (III) have the same definitions as $R^{21}$ and $R^{22}$ in General Formula (II), respectively, and suitable aspects are also the same.

(Compound Represented by General Formula (IV))

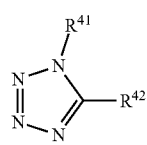

(IV)

In General Formula (IV), $R^{41}$ represents a substituent. $R^{42}$ represents a hydrogen atom, a hydrophilic group, or a hydrocarbon group having a hydrophilic group. In addition, $R^{41}$ and $R^{42}$ may be bonded to each other to form a ring.

In General Formula (IV), as the substituent represented by $R^{41}$, for example, an alkyl group which may have a hydrophilic group (preferably having 1 to 12 carbon atoms, more preferably having 1 to 6 carbon atoms, and still more preferably 1 to 3 carbon atoms), an aryl group (preferably having 6 to 18 carbon atoms, more preferably having 6 to 14 carbon atoms, and still more preferably having 6 to 10 carbon atoms), which may have a hydrophilic group, a hydroxy group, a carboxyl group, and $-N(R_c)(R_d)$. $R_c$ and $R_d$ each independently represent a hydrogen atom or an organic group. As the organic group, an alkyl group (for example, having 1 to 12 carbon atoms, preferably having 1 to 6 carbon atoms, and more preferably having 1 to 4 carbon atoms), or a hydroxyalkyl group (for example, having 1 to 12 carbon atoms, preferably having 1 to 6 carbon atoms, and more preferably having 1 to 4 carbon atoms) is preferable.

The hydrophilic group in the alkyl group which may have the hydrophilic group has the same definition as the hydrophilic group represented by $R^{11}$ in General Formula (I), and a suitable aspect thereof is also the same.

$R^{41}$ is preferably an alkyl group (more preferably the above-mentioned alkyl group having a suitable number of carbon atoms), which may have a hydrophilic group, and an alkyl group having a carboxyl group having 1 to 3 carbon atoms or an alkyl group having 1 to 3 carbon atoms is more preferable, and the alkyl group having 1 to 3 carbon atoms are still more preferable.

The hydrophilic group and the hydrocarbon group having a hydrophilic group represented by $R^{42}$ in General Formula (IV) have the same definitions as the hydrophilic group and the hydrocarbon group having a hydrophilic group represented by each of $R^{11}$ and $R^{12}$ in General Formula (I), respectively.

$R^{42}$ is preferably a hydrogen atom, a hydroxy group, a mercapto group, an amino group, or a hydroxyl group, more preferably the hydrogen atom, the mercapto group, or the amino group, and still more preferably the hydrogen atom.

The compound in which $R^{41}$ and $R^{42}$ in General Formula (IV) are bonded to each other to form a ring is preferable from the viewpoint that the effect of the present invention is more excellent.

In General Formula (IV), examples of the ring formed by bonding $R^{41}$ and $R^{42}$ to each other include an aromatic or non-aromatic hydrocarbon ring, an aromatic or non-aromatic heterocyclic ring, and a polycyclic fused ring formed by combination of two or more rings thereof.

The ring formed by bonding $R^{41}$ and $R^{42}$ to each other is preferably a non-aromatic hydrocarbon ring, more preferably a non-aromatic hydrocarbon ring having 5 to 7 ring members, and still more preferably a cyclohexane ring or a cycloheptane ring.

The ring formed by bonding $R^{41}$ and $R^{42}$ to each other may have a substituent. The substituent is not particularly limited, and examples thereof include those exemplified as the substituent represented by $R^{41}$.

(Compound Represented by General Formula (V))

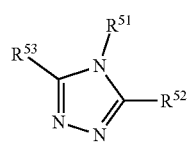

(V)

In General Formula (V), $R^{51}$, $R^{52}$, and $R^{53}$ each independently represent a hydrogen atom, a hydrophilic group, or a hydrocarbon group having a hydrophilic group. In addition, $R^{51}$ and $R^{52}$ may be bonded to each other to form a ring, and $R^{51}$ and $R^{53}$ may be bonded to each other to form a ring.

The hydrophilic group and the hydrocarbon group having a hydrophilic group represented by each of $R^{51}$, $R^{52}$, and $R^{53}$ in General Formula (V) have the same definitions as the hydrophilic group and the hydrocarbon group having a hydrophilic group represented by $R^{11}$ in General Formula (I), respectively, and suitable aspects are also the same.

In addition, examples of the ring formed by bonding $R^{51}$ and $R^{52}$ to each other and the ring formed by bonding $R^{51}$ and $R^{53}$ to each other include the same rings as those formed by bonding $R^{11}$ and $R^{12}$ to each other in General Formula (I), and a suitable aspect is also the same.

As $R^{51}$, $R^{52}$, and $R^{53}$, a hydrogen atom or a hydrophilic group is preferable, it is more preferable that one or more of $R^{51}$, $R^{52}$, and $R^{53}$ represent a hydrophilic group, and it is still more preferable that one or two of $R^{51}$, $R^{52}$, and $R^{53}$ represent hydrophilic groups, and the rest of $R^{51}$, $R^{52}$, and $R^{53}$ represent hydrogen atoms. Among those, a combination in which $R^{51}$ represents a hydrogen atom, a carboxyl group, or an amino group and $R^{52}$ and $R^{53}$ represent a hydrogen atom is preferable, a combination in which $R^{51}$ represents a carboxyl group or an amino group and $R^{52}$ and $R^{53}$ represent a hydrogen atom is more preferable.

Specific examples of the specific compound include 5-carboxybenzotriazole (5-CXBTA), and 5-nitrobenzotriazole (all of which correspond to the compound represented by General Formula (I)), 1-hydroxybenzotriazole (1-HBTA), 1H-benzotriazole-1-methanol (1-MHBTA), and 1-hydroxy-7-azabenzotriazole (all of which correspond to the compounds represented by General Formula (II)), 1-methyl-5-aminotetrazole (1-M-5ATe), 1-methyl-5-mercaptotetrazole (1-M-5Ste), pentetrazole, 1H-tetrazole-1-acetic acid, and 1H-tetrazole-5-acetic acid (all of which correspond to the compound represented by General Formula (IV)), and 4-amino-1,2,4-triazole (which corresponds to the compound represented by General Formula (V)).

The specific compounds may be used alone or in combination of two or more kinds thereof.

The content of the specific compound in the present polishing liquid is preferably 0.0001% to 10% by mass, more preferably 0.0005% to 5% by mass, and still more preferably 0.003% to 3% by mass with respect to the total mass of the polishing liquid.

<Hydrogen Peroxide>

The present polishing liquid includes hydrogen peroxide ($H_2O_2$).

A content of hydrogen peroxide is preferably 0.1% to 10.0% by mass, more preferably 0.2% to 5.0% by mass, and still more preferably 0.5% to 3.0% by mass with respect to the total mass of the present polishing liquid.

<Water>

It is preferable that the present polishing liquid contains water. The water contained in the present polishing liquid is not particularly limited, and examples thereof include ion exchange water and pure water.

A content of water is preferably 90% to 99% by mass with respect to the total mass of the present polishing liquid.

<Surfactant>

It is preferable that the present polishing liquid includes a surfactant.

The surfactant is not particularly limited, and may be any of an anionic surfactant, a cationic surfactant, a nonionic surfactant, and an amphoteric surfactant.

(Anionic Surfactant)

The anionic surfactant is not particularly limited, but typically means an anionic compound having a hydrophilic group and a lipophilic group in the molecule, in which the hydrophilic group portion is dissociated in an aqueous solution to serve as an anion or have an anionic property. Here, the anionic surfactant may be present as an acid accompanied by a hydrogen atom, may be a dissociated anion, or may be a salt thereof. As long as the surfactant is anionic, it may be non-dissociative and includes an acid ester and the like.

The anionic surfactant is preferably an anionic surfactant having one or more anionic groups selected from the group consisting of a carboxylic acid group, a sulfonic acid group, a phosphoric acid group, a phosphonic acid group, a sulfuric acid ester group, a phosphoric acid ester group, and a group which is a salt thereof.

In other words, the anionic anion is preferably an anionic surfactant having one or more anions selected from the group consisting of a carboxylate anion (—COO), a sulfonate anion (—$SO_3^-$), a phosphate anion (—$OPO_3H^-$, —$OPO_3^{2-}$), a phosphonate anion (—$PO_3H^-$, —$PO_3^{2-}$), a sulfuric acid ester anion (—$OSO_3^-$), a phosphoric acid ester anion (*—O—P(=O)O$^-$—O—*, in which * represents a bonding position with an atom other than a hydrogen atom), in the present polishing liquid.

In addition, the anionic surfactant may have two or more of the anionic groups in the present polishing liquid. In this case, the two or more anionic groups which are present may be the same as or different from each other.

Examples of the anionic surfactant include polyoxyethylene alkyl ether carboxylic acid, polyoxyethylene alkyl ether acetic acid, polyoxyethylene alkyl ether propionic acid, and a salt thereof.

Examples of the "salt" include an ammonium salt, a sodium salt, a potassium salt, a trimethylammonium salt, and a triethanolamine salt.

A C log P value of the anionic surfactant is preferably 1.00 to 15.00, and more preferably 2.50 to 10.00.

In addition, a value of a difference obtained by subtracting the C log P value of the specific compound from the C log P value of the anionic surfactant (C log P value of the anionic surfactant−C log P value of the specific compound) is preferably 2.0 or more, and more preferably more than 4.0.

That is, with regard to the present polishing liquid, it is preferable to satisfy "the C log P value of the specific compound+2.0≤the C log P value of the anionic surfactant", and it is more preferable to satisfy "the C log P value of specific compound+4.0<the C log P value of the anionic surfactant".

The upper limit of the value of the difference obtained by subtracting the C log P value of the specific compound from the C log P value of the anionic surfactant is not particularly limited, but is preferably 10.0 or less, and more preferably 8.0 or less.

Furthermore, in a case where the present polishing liquid includes two or more kinds of specific compounds and/or anionic surfactants, it is preferable that a combination of at least one set of a specific compound and an anionic surfactant (preferably a combination of a specific compound with the highest content and an anionic surfactant with the highest content) satisfies the range of the values of the difference.

The content of the anionic surfactant is preferably 0.00001% to 1% by mass, and more preferably 0.0001% to 0.01% by mass by mass with respect to the total mass of the present polishing liquid.

The anionic surfactants may be used alone or in combination of two or more kinds thereof. In a case where two or more kinds of the anionic surfactants are used, a total content thereof is preferably within the range.

A mass ratio (content of the anionic surfactant/content of the specific compound) of the content of the anionic surfactant to the content of the specific compound is preferably 0.0001 to 100, and more preferably 0.0001 to 1.

(Nonionic Surfactant)

It is preferable that the present polishing liquid includes a nonionic surfactant from the viewpoint that the effect of the present invention is more excellent.

Examples of the nonionic surfactant include polyalkylene oxide alkylphenyl ether-based surfactants, polyalkylene oxide alkyl ether-based surfactants, block polymer-based surfactants consisting of polyethylene oxide and polypropylene oxide, polyoxyalkylene distyrenated phenyl ether-based surfactants, polyalkylene tribenzyl phenyl ether-based surfactants, acetylene polyalkylene oxide-based surfactants, polyoxyethylene sorbitol fatty acid ester-based surfactants, and polyoxyethylene alkylamine-based surfactants.

The nonionic surfactant is preferably a compound represented by General Formula (A1).

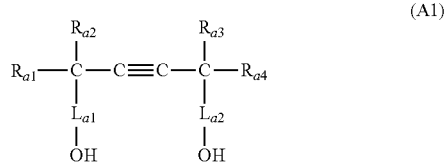

In General Formula (A1), $R_{a1}$, $R_{a2}$, $R_{a3}$ and $R_{a4}$ each independently represent an alkyl group.

The alkyl group of each of $R_{a1}$, $R_{a2}$, $R_{a3}$ and $R_{a4}$ may be linear or branched, and may have a substituent.

The alkyl group of each of $R_{a1}$, $R_{a2}$, $R_{a3}$ and $R_{a4}$ is preferably an alkyl group having 1 to 5 carbon atoms. Examples of the alkyl group having 1 to 5 carbon atoms include a methyl group, an ethyl group, an isopropyl group, and a butyl group.

In General Formula (A1), $L_{a1}$ and $L_{a2}$ each independently represent a single bond or a divalent linking group.

The divalent linking group of each of $L_{a1}$ and $L_{a2}$ is preferably an alkylene group, a $-OR_{a5}-$ group, or a combination thereof. $R_{a5}$ represents an alkylene group (preferably having 1 to 8 carbon atoms).

The compound represented by General Formula (A1) may be, for example, a compound represented by General Formula (A2).

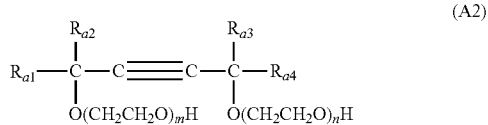

In General Formula (A2), $R_{a1}$, $R_{a2}$, $R_{a3}$, and $R_{a4}$ each independently represent an alkyl group.

The alkyl group of each of $R_{a1}$, $R_{a2}$, $R_{a3}$, and $R_{a4}$ is the same as the alkyl group of each of $R_{a1}$, $R_{a2}$, $R_{a3}$, and $R_{a4}$ in General Formula (A1).

In General Formula (A2), m and n represent the addition number of ethylene oxide, each independently represent a positive number of 0.5 to 80, and satisfy m+n≥1. Any value can be selected as long as the range satisfies m+n≥1. m and n preferably satisfy 1≤m+n≤100, and more preferably satisfy 3≤m+n≤80.

Examples of the nonionic surfactant include 2,4,7,9-tetramethyl-5-decyne-4,7-diol, 3,6-dimethyl-4-octyne-3,6-diol, 3,5-dimethyl-1-hexyne-triol, 2,5,8,11-tetramethyl-6-dodecyne-5,8-diol, 5,8-dimethyl-6-dodecyne-5,8-diol, 4,7-dimethyl-5-decyne-4,7-diol 8-hexadecyne-7,10-diol, 7-tetradecyne-6,9-diol, 2,3,6,7-tetramethyl-4-octyne-3,6-diol, 3,6-diethyl-4-octyne-3,6-diol, 3,6-dimethyl-4-octyne-3,6-diol, and 2,5-dimethyl-3-hexyne-2,5-diol.

In addition, as the nonionic surfactant, a commercially available product may be used. Examples of the commercially available product include SURFYNOL 61, 82, 465, 485, DYNOL 604, 607 manufactured by Air Products & Chemicals, Inc., OLFINE STG and OLFINE E1010 manufactured by Nissin Chemical Co., Ltd., and EMULGEN 103, 108, 150, 220, and 102KG, AMIET 320, and RHEODOL 430 and 460, all manufactured by Kao Corporation.

An HLB value of the nonionic surfactant is preferably 3 to 20, more preferably 8 to 17, and still more preferably 8 to 15 from the viewpoint that the effect of the present invention is more excellent.

Here, the HLB value is defined with a value calculated from the Griffin formula (20Mw/M; Mw=Molecular weight of hydrophilic site, M=Molecular weight of nonionic surfactant), and is calculated by a catalog value or another method in some cases.

In a case where the present polishing liquid includes the nonionic surfactant, a content of the nonionic surfactant is preferably 0.0001% to 1.0% by mass, and more preferably 0.001% to 0.05% by mass with respect to the total mass of the present polishing liquid from the viewpoint that the effect of the present invention is more excellent.

The nonionic surfactants may be used alone or in combination of two or more kinds thereof. In a case where two or more kinds of the nonionic surfactants are used, a total content thereof is preferably within the range.

It is preferable that the present polishing liquid includes both the above-mentioned anionic surfactant and nonionic surfactant from the viewpoint that the effect of the present invention is more excellent.

In a case where the present polishing liquid includes the anionic surfactant and the nonionic surfactant, a mass ratio (content of the anionic surfactant/content of the nonionic surfactant) of the content of the anionic surfactant to the content of the nonionic surfactant is preferably 0.001 to 1,000, and more preferably 0.005 to 10.

<Sodium and Potassium>

It is preferable that the polishing liquid includes one or more selected from the group consisting of sodium and potassium, and it is more preferable that the present polishing liquid includes sodium and potassium.

In the present polishing liquid, sodium and potassium may exist in the state of particles (particles including sodium and/or potassium, or the like), or may exist in the state of ions.

A content of sodium is preferably 1 to 250 ppt by mass, and more preferably 10 to 150 ppt by mass with respect to the total mass of the present polishing liquid.

A content of potassium is preferably $1.0 \times 10^5$ to $2.0 \times 10^{11}$ ppt by mass, and more preferably $1.0 \times 10^7$ to $1.0 \times 10^{11}$ ppt by mass, and still more preferably $1.0 \times 10^8$ to $5 \times 10^{10}$ ppt by mass.

The contents of sodium and potassium in the present polishing liquid can be measured by inductively coupled plasma mass spectrometry (ICP-MS method, inductively coupled plasma mass spectrometry), respectively. In the ICP-MS method, the contents of sodium and potassium as a target to be measured are measured regardless of existence forms thereof.

Sodium and/or potassium in the polishing liquid may be introduced into the polishing liquid as a component included as a trace component (impurity) in a raw material used for the production of the present polishing liquid or may be introduced as a cation in a raw material which is a salt (a surfactant which is a salt), or a raw material which serves as a supply source of sodium and potassium (sodium hydroxide, potassium hydroxide, and the like) may be individually added and introduced at the time of production of the present polishing liquid.

In a case where the present polishing liquid includes sodium and potassium, a mass ratio (content of potassium/content of sodium (K/Na)) of the content of potassium to the content of sodium is preferably $1.0 \times 10^3$ to $1.0 \times 10^{12}$, more preferably $1.0 \times 10^3$ to $1.0 \times 10^{11}$, and still more preferably $1.0 \times 10^4$ to $3.0 \times 10^{10}$ from the viewpoint that the effect of the present invention is more excellent.

<Organic Solvent>

It is preferable that the present polishing liquid includes an organic solvent.

The organic solvent is preferably a water-soluble organic solvent.

Examples of the organic solvent include ketone-based solvents, ether-based solvents, alcohol-based solvents, glycol-based solvents, glycol ether-based solvents, and amide-based solvents.

More specific examples thereof include acetone, methyl ethyl ketone, tetrahydrofuran, dioxane, dimethylacetamide, N-methylpyrrolidone, dimethylsulfoxide, acetonitrile, methanol, ethanol, 1-propanol, 2-propanol, 1-butanol, ethylene glycol, propylene glycol, and ethoxy ethanol.

Among those, ethylene glycol is preferable.

In a case where the present polishing liquid includes the organic solvent, a content of the organic solvent is preferably 0.001% to 10% by mass, more preferably 0.005% to 5% by mass, and still more preferably 0.01% to 1% by mass with respect to the total mass of the present polishing liquid from the viewpoint that a balance of the performance of the polishing liquid is excellent.

The organic solvents may be used alone or in combination of two or more kinds thereof. In a case where two or more kinds of the organic solvents are used in combination, a total content thereof is preferably within the range.

<pH Adjuster>

In addition to the above-mentioned components, the present polishing liquid may include a pH adjuster for adjusting a pH to a predetermined range.

Examples of the pH adjuster for adjusting a pH to an acidic side include sulfuric acid, and examples of the pH adjuster for adjusting the pH to a basic side include tetramethylammonium hydroxide (TMAH).

The pH adjuster may be an amount suitable for adjusting the pH to a predetermined pH.

The pH adjusters may be used alone or in combination of two or more kinds thereof <Other Components>

The present polishing liquid may include components (other components) other than the above-mentioned components as long as the above-mentioned effects of the present invention are not impaired.

Examples of other components include a nitrogen-containing aromatic heterocyclic compound other than the specific compound (that is, a nitrogen-containing aromatic heterocyclic compound other than the compounds represented by General Formulae (I) to (V), and the compounds represented by General Formulae (I) to (V) and having a C log P value of 1 or more), and particles other than colloidal silica.

It is preferable that the present polishing liquid does not substantially contain a compound having a C log P value of 1 or more, other than a surfactant, from the viewpoint that the effect of the present invention is more excellent. Incidentally, the term "not substantially containing" means that the component in the present polishing liquid is at a level below the measurement limit.

[Physical Properties and the Like]

<pH>

A pH of the present polishing liquid is 8.5 to 12.0.

The pH of the present polishing liquid is preferably more than 9.0 and less than 12.0, and more preferably 9.5 to 11.5.

<Corrosion Potential>

The present polishing liquid is preferably adjusted so that a corrosion potential of cobalt (metal cobalt) in the polishing liquid is −0.2 to 0.5 V.

The corrosion potential can be measured by the following method.

<Method for Measuring Corrosion Potential>

Device: Model 263A (trade name), Princeton Applied Research

Substrate: Co substrate (P-type, 1 to 35 Ω·cm) obtained by removing a natural oxide film on a surface by performing a treatment with a 1% citric acid solution for 30 seconds 1. Clip a substrate (measurement material) which has been subjected to a pretreatment (the above-mentioned treatment for removal of a natural oxide film) as a working electrode.
2. Clip an Ag/AgCl reference electrode filled with a saturated KCl/AgCl solution as a reference electrode.
3. Clip a platinum counter electrode: TCE-1 manufactured by Princeton Applied Research as a counter electrode.
4. Put a measurement solution (the present polishing liquid) into a cell.
5. Start the measurement.
  (1) Select a Tafel plot in a linear sweep mode.
  (2) Set it to sweep at an open circuit potential of ±0.5 V.
6. Read a corrosion potential from a VI graph.

<Ratio of Polishing Speed>

Figure 2:
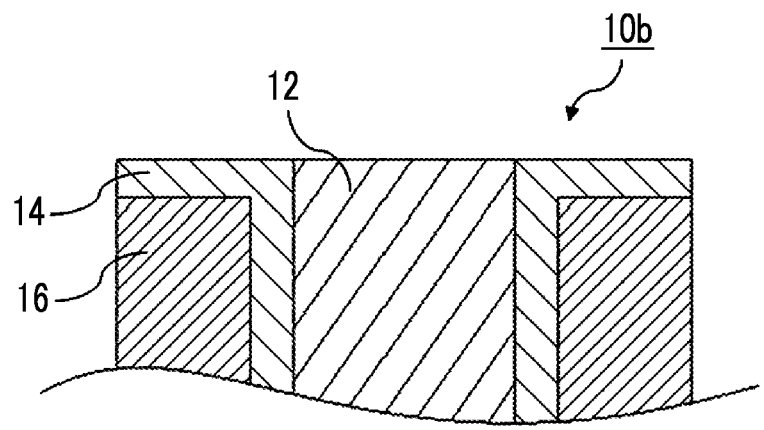
FIG. 2 is a schematic view showing an example of an object to be polished for which a chemical mechanical polishing method is carried out.

As in the polishing of the object to be polished shown in FIG. 2 as described above, in the present CMP method, it is preferable that the object to be polished has a second layer (a barrier layer and/or an interlayer insulating film, and the like) consisting of a material different from the cobalt-containing film (first layer). In addition, it is preferable that the second layer is polished at the same time as the cobalt-containing film (first layer).

That is, in the present CMP method, it is preferable that a cobalt-containing film as the first layer and a layer (a barrier layer, and/or an interlayer insulating film, and the like) as the second layer, consisting of a material different from the cobalt-containing film, are polished at the same time.

Both the first layer and the second layer may be exposed at the same time on the surface to be polished on the same plane in the polishing, as in the object to be polished shown in FIG. 2.

At this time, it is preferable that the difference between the polishing speed with respect to the first layer and the polishing speed with respect to the second layer is not extremely large from the viewpoint of the uniformity of the surface to be polished of the obtained object to be polished, which has been polished.

Specifically, a speed ratio (polishing speed of the first layer/polishing speed of the second layer) of the polishing speed of the first layer to the polishing speed of the second layer is preferably more than 0.01 and 20 or less, and more preferably more than 0.05 and less than 5.

The second layer is, for example, a barrier layer and/or an interlayer insulating film. More specifically, the second layer is preferably a layer including one or more materials selected from the group consisting of tantalum (Ta), tantalum nitride (TaN), titanium nitride (TiN), titanium tungsten (TiW), tungsten (W), silicon nitride (SiN), tetraethoxysilane (TEOS), silicon oxycarbide (SiOC), and silicon carbide (SiC), and more preferably a layer including one or more selected from the group consisting of Ta, TaN, TiN, SiN, TEOS, SiOC, and SiC.

In the present CMP method, the speed ratio ("polishing speed of the cobalt-containing film (preferably Co)"/"polishing speed of Ta, TaN, TiN, SiN, TEOS, SiOC, and/or SiC") of the polishing speed of the cobalt-containing film (preferably Co) to the polishing speed of Ta, TaN, TiN, SiN, TEOS, SiOC, and/or SiC is preferably more than 0.01 and 20 or less, and more preferably more than 0.05 and less than 5.

[Method for Producing Polishing Liquid]

A method for producing the present polishing liquid is not particularly limited, and a known production method can be used.

For example, the present polishing liquid may be produced by mixing each of the above-mentioned components to have a predetermined concentration.

In order to remove impurities or coarse particles in the present polishing liquid, it is also preferable that raw materials used are subjected to a desalination treatment (filtration and the like) before mixing, or the mixture is subjected to a desalination treatment (filtration and the like.) after mixing the raw materials.

Moreover, the present polishing liquid adjusted to a high concentration (high-concentration polishing liquid) may be diluted to obtain the present polishing liquid having a desired formulation. The high-concentration polishing liquid is a mixture of which formulation is adjusted so that the present polishing liquid having a desired formulation can be produced by diluting with a solvent such as water.

The dilution ratio in a case of diluting the high-concentration polishing liquid is preferably 2 times or more, and more preferably 2 to 20 times, on a mass basis.

The concentration of solid contents of the high-concentration polishing liquid is preferably 5% by mass or more, and more preferably 5% to 50% by mass. It is preferable to dilute the high-concentration polishing liquid to obtain the present polishing liquid having a preferred concentration of solid contents (for example, 0.1% to 10% by mass, and more preferably 0.5% by mass or more and less than 5% by mass).

Incidentally, the solid contents are intended to be all components other than water, hydrogen peroxide, and the organic solvent in the present polishing liquid.

[Chemical Mechanical Polishing Method]

A chemical mechanical polishing method of an embodiment of the present invention (hereinafter also referred to as "the present CMP method") includes a step of obtaining an object to be polished, which has been polished, by bringing a surface to be polished of an object to be polished into contact with a polishing pad attached to a polishing platen while supplying the above-mentioned polishing liquid to the polishing pad, and relatively moving the object to be polished and the polishing pad to polish the surface to be polished.

<Object to be Polished>

An object to be polished to which the CMP method according to the embodiment can be applied is not particularly limited and includes an aspect in which the object to be polished has a film containing at least one metal selected from the group consisting of copper, an copper alloy, and cobalt as a wiring line metal element, and an aspect in which the object to be polished has a cobalt-containing film is preferable.

The cobalt-containing film only needs to include at least cobalt (Co) and may include other components. The state of cobalt in the cobalt-containing film is not particularly limited, and may be, for example, a simple substance or an alloy. Above all, the cobalt in the cobalt-containing film is preferably cobalt as the simple substance. A content of cobalt (preferably cobalt as a simple substance) in the cobalt-containing film is preferably 50% to 100% by mass, more preferably 80% to 100% by mass, and still more preferably 99% to 100% by mass with respect to a total mass of the cobalt-containing film.

An example of the object to be polished can be a substrate having a cobalt-containing film on the surface.

More specific examples of the object to be polished include an object 10b to be polished shown in FIG. 2 which will be described later, and the object 10b to be polished shown in FIG. 2 can be obtained by, for example, subjecting the object 10a to be pretreated shown in FIG. 1 which will be described later to a pretreatment.

FIG. 1 is a schematic view showing an example of an object to be pretreated, which is subjected to a pretreatment for obtaining an object to be polished for which the present CMP method is carried out. An upper part of a cross-section of the object to be pretreated is shown in FIG. 1.

An object 10a to be pretreated shown in FIG. 1 includes a substrate not shown in the drawing, an interlayer insulating film 16 having a groove (for example, a groove for a wiring line) arranged on the substrate, a barrier layer 14 arranged along the shape of the groove, and a cobalt-containing film 12 arranged so that the groove is filled therewith. The cobalt-containing film with which the groove is filled is arranged at a position higher than an opening of the groove to further overflow. Such a portion of the cobalt-containing film 12, which is formed at a position higher than the opening of the groove, is referred to as a bulk layer 18.

By polishing the surface to be treated, which is a surface of the bulk layer 18, and performing the polishing until the barrier layer 14 is exposed on the surface to be polished, the bulk layer 18 can be removed to obtain an object 10b to be polished shown in FIG. 2. The removal of the bulk layer 18 can be carried out by, for example, CMP using a polishing liquid different from the present polishing liquid.

Furthermore, in the object 10b to be polished shown in FIG. 2, the bulk layer 18 is completely removed, but the polishing of the bulk layer 18 may be completed before the bulk layer 18 is completely removed. That is, the polishing may be completed in the state where the bulk layer 18 partially or completely covers the barrier layer 14.

FIG. 2 is a schematic view showing an example of an object to be polished for which the present CMP method is carried out.

In the object 10b to be polished shown in FIG. 2, the bulk layer 18 is removed from the object 10a to be pretreated, and thus, the barrier layer 14 and the cobalt-containing film 12 are exposed on the surface to be treated.

In the present CMP method, the barrier layer 14 and the cobalt-containing film 12 exposed on the surface to be treated are polished at the same time, using the present polishing liquid as a polishing liquid for a barrier, and the interlayer insulating film 16 is polished until it is exposed on the surface to be polished, thereby removing the barrier layer 14. In a case where the barrier layer 14 is removed from the object 10b to be polished by polishing, an object 10c to be polished, which has been polished, shown in FIG. 3 can be obtained.

That is, the present CMP method is preferably performed to form a wiring line consisting of a cobalt-containing film.

Furthermore, even after the interlayer insulating film 16 is exposed on the surface to be polished, the polishing of the interlayer insulating film 16, the barrier layer 14 arranged along the shape of the grooves of the interlayer insulating film 16, and/or the cobalt-containing film 12 (wiring line) with which the grooves are filled may be intentionally or unavoidably continued.

In addition, in the object 10b to be polished in FIG. 2, the bulk layer is completely removed, but a part of the bulk layer may not be completely removed, and the bulk layer which has not been completely removed may partially or completely cover a surface to be treated of the object 10b to be polished. In the present CMP method, such a bulk layer which has not been completely removed may also be polished and removed.

Figure 3:
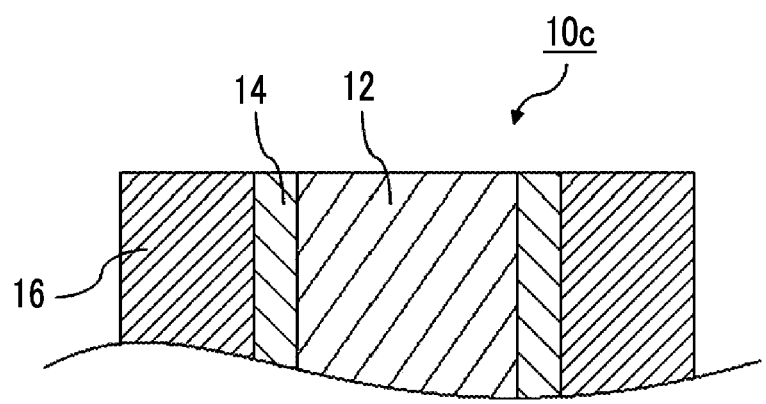
FIG. 3 is a schematic view showing an example of an object to be polished, which has been polished, obtained by carrying out a chemical mechanical polishing method.

In addition, in the object 10c to be polished, which has been polished, in FIG. 3, the barrier layer 14 on the interlayer insulating film 16 is completely removed, but the polishing may be completed before the barrier layer 14 on the interlayer insulating film 16 is completely removed. That is, the object to be polished, which has been polished, may be obtained by finishing the polishing in the state where the barrier layer 14 partially or completely covers the interlayer insulating film 16.

Examples of the interlayer insulating film 16 include an interlayer insulating film including one or more materials selected from a group consisting of silicon nitride (SiN), silicon oxide, silicon carbide (SiC), silicon carbide, silicon oxycarbide (SiOC), silicon oxynitride, and tetraethoxysilane (TEOS). Among those, silicon nitride (SiN), TEOS, silicon carbide (SiC), and silicon oxycarbide (SiOC) are preferable. In addition, the interlayer insulating film 16 may be formed of a plurality of films. Examples of the interlayer insulating film 16 formed of a plurality of films include an insulating film formed by combining a film including silicon oxide and a film including silicon oxycarbide.

Examples of the barrier layer 14 include a barrier layer including one or more materials selected from the group consisting of tantalum (Ta), tantalum nitride (TaN), titanium nitride (TiN), tungsten nitride (TiW), tungsten (W), and tungsten nitride (WN). Among those, Ta, TaN, or TiN is preferable.

Specific examples of the substrate include a semiconductor substrate consisting of a single layer and a semiconductor substrate consisting of multiple layers.

Specific examples of the material constituting the semiconductor substrate consisting of a single layer include Groups III to V compounds such as silicon, silicon germanium, and GaAs, or any combination thereof.

Specific examples of the semiconductor substrate consisting of multiple layers include a substrate in which an exposed integrated circuit structure such as interconnect features such as a metal wire and a dielectric material is arranged on the above-mentioned semiconductor substrate such as silicon.

Examples of a commercially available products of the object to be polished to which the present CMP method is applied include SEMATECH 754TEG (manufactured by SEMATECH Inc.).

<Polishing Device>

A known chemical mechanical polishing device (hereinafter also referred to as a "CMP device") can be used as a polishing device with which the present CMP method can be carried out.

Examples of the CMP device include a CMP device having a holder for holding an object to be polished having a surface to be polished, and a polishing platen to which a polishing pad is attached (to which a motor or the like with a rotation speed being changeable is attached).

<Polishing Pressure>

A polishing pressure in the present CMP method is preferably 0.1 to 5.0 psi, more preferably 0.5 to 3.0 psi, and still more preferably 1.0 to 3.0 psi from the viewpoint that generation of scratch-like defects of a surface to be polished can be suppressed and the surface to be polished after polishing is likely to be uniform. Furthermore, the polishing pressure means a pressure generated on a contact surface between the surface to be polished and the polishing pad.

<Rotation Speed of Polishing Platen>

A rotation speed of the polishing platen in the present CMP method is preferably 50 to 200 rpm, and more preferably 60 to 150 rpm.

Incidentally, in order to relatively move the object to be polished and the polishing pad, the holder may be rotated and/or rocked, the polishing platen may be rotated by planetary rotation, or a belt-shaped polishing pad may be moved linearly in one of longitudinal directions. Furthermore, the holder may be in any state of being fixed, rotating, or rocked. These polishing methods can be appropriately selected depending on a surface to be polished and/or a polishing device as long as the object to be polished and the polishing pad are relatively moved.

<Method for Supplying Polishing Liquid>

In the present CMP method, it is preferable to continuously supply the present polishing liquid to the polishing pad on the polishing platen by a device such as a pump while polishing a surface to be polished. Although an amount of the present polishing liquid to be supplied is not limited, it is preferable that a surface of the polishing pad is always covered with the present polishing liquid.

For example, a supply rate of the polishing liquid is preferably 0.05 to 0.75 ml/(min·cm$^2$), more preferably 0.14 to 0.35 ml/(min·cm$^2$), and still more preferably 0.21 to 0.35 ml/(min·cm$^2$) from the viewpoint that generation of scratch-like defects on a surface to be polished can be suppressed and the surface to be polished is likely to be uniform after polishing.

<Cleaning Step>

It is also preferable that the present CMP method has a cleaning step of cleaning the obtained object to be polished, which has been polished, after the step of obtaining the object to be polished, which has been polished.

Residues of polishing debris generated by polishing and/or residues based on the components included in the present polishing liquid, and the like can be removed by the cleaning step.

The cleaning liquid used in the cleaning step is not limited, and examples thereof include a cleaning liquid that is alkaline (alkaline cleaning liquid), a cleaning liquid that is acidic (acidic cleaning liquid), water, and an organic solvent, and among these, the alkaline cleaning liquid is preferable from the viewpoint that the alkaline cleaning liquid has a residue removing property and can suppress the surface roughness of a surface to be polished after washing (for example, a wiring line consisting of a cobalt-containing film exposed on the surface to be polished by the polishing step).

In addition, after the cleaning step, a post-cleaning step for removing the cleaning liquid adhering to the object to be polished, which has been polished, may be further carried out. Specific embodiments of the post-cleaning step in the present step include a method of further cleaning the object to be polished, which has been polished, after the cleaning step with a post-cleaning liquid such as an organic solvent and water.

EXAMPLES

Hereinbelow, the present invention will be described in more detail with reference to Examples. The materials, the amounts of materials used, the proportions, the treatment details, the treatment procedure, or the like shown in the Examples below may be modified as appropriate as long as the modifications do not depart from the spirit of the present invention. Therefore, the scope of the present invention should not be construed as being limited to Examples shown below. In addition, "%" means "% by mass" unless otherwise specified.

Example A

[Preparation of Polishing Liquid]
<Raw Materials>
The polishing liquids shown in Table 1-1 to Table 1-3 below were prepared using the following raw materials.
(Colloidal Silica)
  PL1 (product name, manufactured by Fuso Chemical Co., Ltd., colloidal silica, average primary particle diameter of 15 nm, degree of association of 2.7)
(Organic Acid)
  Malonic acid
  Citric acid (CA)
(Nitrogen-Containing Aromatic Heterocyclic Compound)
  1-Hydroxybenzotriazole (1-HBTA, corresponding to a specific compound represented by General Formula (II))
  1H-Benzotriazole-1-methanol (1-MHBTA, corresponding to a specific compound represented by General Formula (II))
  5-Carboxybenzotriazole (5-CXBTA, corresponding to a specific compound represented by General Formula (I))
  1-Methyl-5-aminotetrazole (1-M-5ATe, corresponding to a specific compound represented by General Formula (IV))
  1-Methyl-5-mercaptotetrazole (1-M-5Ste, corresponding to a specific compound represented by General Formula (IV))
  Pentetrazole (corresponding to a specific compound represented by General Formula (IV))
  5-Nitrobenzotriazole (corresponding to a specific compound represented by General Formula (I))
  4-Amino-1,2,4-triazole (corresponding to a specific compound represented by General Formula (V))
  1-Hydroxy-7-azabenzotriazole (corresponding to a specific compound represented by General Formula (II))
  1H-tetrazole-1-acetic acid (corresponding to a specific compound represented by General Formula (IV))
  Benzotriazole (having a C log P value of 1 or more, and not corresponding to a specific compound)
  5-Aminotetrazole (not corresponding to any of the compounds represented by General Formulae (I) to (V) and not corresponding to a specific compound)
(Nonionic Surfactant)
  EMULGEN 108 (manufactured by Kao Corporation, polyoxyethylene lauryl ether, HLB value=12.1)
  EMULGEN 103 (manufactured by Kao Corporation, polyoxyethylene lauryl ether, HLB value=8.1)
  AMIET 320 (manufactured by Kao Corporation, polyoxyethylene alkylamine, HLB value=12.1)
  Surfinol 465 (manufactured by Nissin Chemical Co., Ltd., acetylene polyethylene oxide, HLB value=16.0)
  RHEODOL 430 (manufactured by Kao Corporation, polyoxyethylene sorbitol tetraoleate, HLB value=10.8)
  EMULGEN 220 (manufactured by Kao Corporation, polyoxyethylene cetyl ether, HLB value=14.2)
  EMULGEN 102KG (manufactured by Kao Corporation, polyoxyethylene lauryl ether, HLB value=6.3)
  RHEODOL 460 (manufactured by Kao Corporation, polyoxyethylene sorbitol tetraoleate, HLB value=13.8)
  EMULGEN 150 (manufactured by Kao Corporation, polyoxyethylene lauryl ether, HLB value=18.4)
(Anionic Surfactant)
  Tridecyl ether acetic acid (ECT-7)
($H_2O_2$)
  Hydrogen peroxide
(Organic Solvent)
  Ethylene glycol (ETG)
(Potassium (K))
  Potassium hydroxide (potassium hydroxide was added as a supply source of potassium component for a polishing liquid)
(pH Adjuster)
  Sulfuric acid ($H_2SO_4$)
  Tetramethylammonium hydroxide (TMAH)
(Water)
  Water (Ultrapure water)
<Preparation of Polishing Liquid>
The respective raw materials (or aqueous solutions thereof) were subjected to a filtration treatment through a high-density polyethylene filter. At this time, an aqueous solution of colloidal silica was filtered through a filter having a pore size of 0.1 and the other raw materials (or aqueous solutions thereof) were filtered through a filter having a pore size of 0.02 µm. The content of the metal components in the raw materials (or aqueous solutions thereof) was reduced by a filtration treatment. The number of times of filtration for each raw material was adjusted so that the content of Na and/or K in a polishing liquid thus finally obtained was an amount shown in the table below.

The respective raw materials (or aqueous solutions thereof) after the filtration treatments were mixed to prepare the polishing liquid of each of Examples or Comparative Examples shown in Table 1-1 to Table 1-3 below.

Furthermore, the contents of Na and K in the raw material and the polishing liquid were measured using an Agilent 7800 triple quadrupole inductively coupled plasma mass spectrometry (ICP-MS, option #200).

The components of the produced polishing liquid are shown in the tables below.

The "Amount" column in the tables indicates the content of each component with respect to the total mass of the polishing liquid.

The description of "%" and "ppm" indicates "% by mass" and "ppm by mass", respectively.

The content of each component in the tables indicates a content of each component as a compound. For example, hydrogen peroxide was added in the state of an aqueous hydrogen peroxide solution in the preparation of the polishing liquid, but the description of the content in the "Hydrogen peroxide" column in the tables indicates a content of hydrogen peroxide ($H_2O_2$) itself included in the polishing liquid, not that of the aqueous hydrogen peroxide solution added to the polishing liquid.

The content of the colloidal silica indicates a content of the silica colloidal particles themselves included in the polishing liquid.

The description of "Adjusted" as the content of the pH adjuster indicates that either $H_2SO_4$ or TMAH is added in an amount such that the pH of a polishing liquid thus finally obtained is a value shown in the "pH" column.

The description of "Balance" as the amount of water to be added indicates that the component other than the components shown in the tables in the polishing liquid is water.

In the tables, the "C log P" column of "Nitrogen-containing aromatic heterocyclic compound" and "Anionic surfactant" shows the C log P values of the nitrogen-containing aromatic heterocyclic compounds and the C log P values of the anionic surfactants, respectively.

The "HLB" column of the "Nonionic surfactant" shows the HLB values of the nonionic surfactants.

The "ΔC log P" column shows a value of a difference obtained by subtracting the C log P value of the nitrogen-containing aromatic heterocyclic compound from the C log P value of the anionic surfactant (C log P value of the anionic surfactant−C log P value of the nitrogen-containing aromatic heterocyclic compound).

The "Ratio" column in the tables shows a mass ratio (content of the anionic surfactant/content of the nitrogen-containing aromatic heterocyclic compound) of the content of the anionic surfactant to the content of the nitrogen-containing aromatic heterocyclic compound in the polishing liquid.

The "K/Na" column shows a mass ratio (content of K/content of Na) of the content of K to the content of Na in the polishing liquid.

The description of "E+Number" in each cell indicates "$\times 10^{number}$".

For example, the polishing liquid of Example 1 includes 4.50% by mass of PL1 as colloidal silica, 0.3% by mass and 0.1% by mass of malonic acid and citric acid, each as an organic acid, 0.02% by mass of 1-hydroxybenzotriazole as the specific compound, 1.0% by mass of hydrogen peroxide, 0.05% by mass of ethylene glycol as an organic solvent, $1.1 \times 10^{10}$ ppt by mass of K, 51 ppt by mass of Na, and a pH adjuster in an amount that brings the pH of the final polishing liquid to 10.0 as a whole, and the residual component is water.

[Tests]

The following evaluations were each performed using the obtained polishing liquids.

<Evaluation of Erosion Suppressing Property>

A wafer was polished under the conditions that a polishing pressure was set to 2.0 psi and a supply rate of the polishing liquid was set to 0.28 ml/(min·cm$^2$), using FREX300SII (polishing device).

Incidentally, in the wafer, an interlayer insulating film consisting of silicon oxide was formed on a silicon substrate having a diameter of 12 inches (30.48 cm), and the interlayer insulating film was engraved with a groove having a line-and-space pattern consisting of a line of 9 μm and a space of 1 μm. A barrier layer (material: TiN, film thickness: 10 nm) was arranged along the shape of the groove, and the groove was filled with Co. Further, a bulk layer consisting of Co, having a film thickness of 150 to 300 nm, was formed on an upper part of a line-and-space part so that Co overflowed from the groove.

First, with respect to the wafer, the Co (bulk) of the non-wiring part was completely polished using CSL5152C (trade name, manufactured by FUJIFILM Planar Solutions, LLC) as a polishing liquid for a bulk and then polishing was further performed for 10 seconds. Thereafter, polishing was performed for 1 minute under the same conditions, using each of the polishing liquids of Examples or Comparative Examples.

A level difference (height difference) between a reference surface (the highest position in the wafer after polishing) and a central portion of the space part (a portion in which a barrier layer or an interlayer insulating film was exposed) on the wafer after polishing was measured, level differences in the line-and-space part (line of 9 μm, space of 1 μm) were measured, and an average value of the level differences in the entire wafer was classified according to the following categories.

The level difference is erosion, and it can be evaluated that the smaller the level difference (an average value of the level differences) is, the more excellent the erosion suppressing property is.

AAA: The level difference is less than 5 nm

AA: The level difference is 5 nm or more and less than 8 nm

A: Steps are 8 nm or more and less than 10 nm

B: The level difference is 10 nm or more and less than 12 nm

C: The level difference is 12 nm or more and less than 15 nm

D: The level difference is 15 nm or more

<Evaluation of Scratch Suppressing Property—1>

A wafer was polished under the conditions that a polishing pressure was set to 2.0 psi and a supply rate of the polishing liquid was set to 0.28 ml/(min·cm$^2$), using FREX300SII (polishing device).

Incidentally, in the wafer, an interlayer insulating film consisting of silicon nitride was formed on a silicon substrate having a diameter of 12 cm, and the interlayer insulating film was engraved with a groove having a line-and-space pattern consisting of a line of 9 μm and a space of 1 μm. A barrier layer (material: TiN, film thickness: 10 nm) was arranged along the shape of the groove, and the groove was filled with Co. Further, a bulk layer consisting of Co, having a film thickness of 150 to 300 nm, was formed on an upper part of a line-and-space part so that Co overflowed from the groove.

First, Co (bulk) of the non-wiring part was completely polished using CSL5152C (trade name, manufactured by FUJIFILM Planar Solutions, LLC) as bulk polishing liquid, and then polishing was further performed for 10 seconds. Thereafter, polishing was performed for 1 minute under the same conditions, using each of the polishing liquids of Examples or Comparative Examples. The wafer after polishing was cleaned with an alkaline cleaning liquid (pCMP liquid, trade name "CL9010", manufactured by Fujifilm Electronics Materials Co., Ltd.)) for 1 minute in a cleaning unit, further subjected to isopropanol (IPA) cleaning for 30 minutes, and then subjected to a drying treatment.

The obtained wafer was measured by a defect detection device, coordinates where defects having a major diameter of 0.06 μm or more were present were identified, and then the types of the defects at the identified coordinates were classified. The number of scratches (scratch-like defects) detected on the wafer was classified according to the following categories.

It can be evaluated that the smaller the number of the scratches is, the more excellent the scratch suppressing property is.

AAA: The number of the scratches is 1 or less
AA: The number of the scratches is 2 or 3
A: The number of the scratches is 4 or 5
B: The number of the scratches is 6 to 10
C: The number of the scratches is 11 to 15
D: The number of the scratches is 16 or more <Reliability>

A BDII wafer (trade name, manufactured by Applied Materials, Inc.) was polished using each of the polishing liquids of Examples or Comparative Examples under the conditions that a polishing pressure was set to 2.0 psi and the supply rate of the polishing liquid was set to 0.28 ml/(min·cm$^2$), using FREX300SII (polishing device). The polishing time was 60 seconds. The wafer after polishing was baked (heated) at 200° C. for 30 seconds to remove water in the wafer.

Incidentally, the BDII wafer is a wafer in which black diamond (silicon carbide, a low dielectric constant (Low-k) material manufactured by Applied Materials, Inc.) is arranged on silicon.

A k value (relative permittivity) on a surface of the black diamond which had not been subjected to a polishing treatment and a k value on a surface of the black diamond which had been subjected to a polishing treatment were checked, and the reliability was evaluated based on the difference (a rise value of the k value due to the polishing treatment). The smaller the difference is, the better the reliability is.

AAA: The rise value in the k value is less than a detection limit

AA: The rise value in the k value is a detection limit or more and less than 0.03

A: The rise value in the k value is 0.03 or more and less than 0.05

B: The rise value in the k value is 0.05 or more and less than 0.08

C: The rise value in the k value is 0.08 or more and less than 0.10

D: The rise value in the k value is 0.10 or more

The tables below show the evaluation results of the tests performed using the polishing liquid of each of Examples or Comparative Examples.

TABLE 1

TABLE 1-1

| | Colloidal silica | | Organic acid | | Nitrogen-containing aromatic heterocyclic compound | | | Nonionic surfactant | | |
|---|---|---|---|---|---|---|---|---|---|---|
| | Type | Amount (%) | Type | Amount (%) | Type | ClogP | Amount (%) | Type | HLB | Amount (%) |
| Example 1 | PL1 | 4.50 | Malonic acid | 0.3 | 1-HBTA | 0.69 | 0.02 | Emulgen 108 | 12.1 | 0.0050 |
| | | | CA | 0.1 | | | | | | |
| Example 2 | PL1 | 4.50 | Malonic acid | 0.3 | 1-MHBTA | 0.54 | 0.02 | Emulgen 103 | 8.1 | 0.0050 |
| | | | CA | 0.1 | | | | | | |
| Example 3 | PL1 | 4.50 | Malonic acid | 0.3 | 5-CXBTA | −0.46 | 0.02 | Amitet 320 | 12.1 | 0.0050 |
| | | | CA | 0.1 | | | | | | |
| Example 4 | PL1 | 4.50 | Malonic acid | 0.3 | 1-M-5ATe | −1.3 | 0.02 | Surfynol 465 | 16.0 | 0.0050 |
| | | | CA | 0.1 | | | | | | |
| Example 5 | PL1 | 4.50 | Malonic acid | 0.3 | 1-M-5Ste | 0.12 | 0.02 | Emulgen 108 | 12.1 | 0.0050 |
| | | | CA | 0.1 | | | | | | |
| Example 6 | PL1 | 4.50 | Malonic acid | 0.3 | Pentetrazole | 0.14 | 0.02 | Rheodol 430 | 10.8 | 0.0050 |
| | | | CA | 0.1 | | | | | | |
| Example 7 | PL1 | 4.50 | Malonic acid | 0.3 | 5-Nitrobenzotriazole | 0.87 | 0.02 | Emulgen 220 | 14.2 | 0.0050 |
| | | | CA | 0.1 | | | | | | |
| Example 8 | PL1 | 4.50 | Malonic acid | 0.3 | 4-Amino-1,2,4-triazole | −1.38 | 0.02 | Rheodol 430 | 10.8 | 0.0050 |
| | | | CA | 0.1 | | | | | | |
| Example 9 | PL1 | 4.50 | Malonic acid | 0.3 | 1-Hydroxy-7-azabenzotriazole | −0.68 | 0.02 | Emulgen 103 | 8.1 | 0.0050 |
| | | | CA | 0.1 | | | | | | |
| Example 10 | PL1 | 4.50 | Malonic acid | 0.3 | 1-HBTA | 0.69 | 0.02 | Amitet 320 | 12.1 | 0.0050 |
| | | | CA | 0.1 | | | | | | |
| Example 11 | PL1 | 4.50 | Malonic acid | 0.3 | 1-MHBTA | 0.54 | 0.02 | Rheodol 430 | 10.8 | 0.0050 |
| | | | CA | 0.1 | | | | | | |
| Example 12 | PL1 | 4.50 | Malonic acid | 0.3 | 5-CXBTA | −0.46 | 0.02 | Emulgen 108 | 12.1 | 0.0050 |
| | | | CA | 0.1 | | | | | | |
| Example 13 | PL1 | 4.50 | Malonic acid | 0.3 | 1-M-5ATe | −1.3 | 0.02 | Rheodol 430 | 10.8 | 0.0050 |
| | | | CA | 0.1 | | | | | | |
| Example 14 | PL1 | 4.50 | Malonic acid | 0.3 | 1-M-5Ste | 0.12 | 0.02 | Emulgen 103 | 8.1 | 0.0050 |
| | | | CA | 0.1 | | | | | | |
| Example 15 | PL1 | 4.50 | Malonic acid | 0.3 | Pentetrazole | 0.14 | 0.02 | Amitet 320 | 12.1 | 0.0050 |
| | | | CA | 0.1 | | | | | | |
| Example 16 | PL1 | 4.50 | Malonic acid | 0.3 | 5-Nitrobenzotriazole | 0.87 | 0.02 | Emulgen 102KG | 6.3 | 0.0050 |
| | | | CA | 0.1 | | | | | | |
| Example 17 | PL1 | 4.50 | Malonic acid | 0.3 | 4-Amino-1,2,4-triazole | −1.38 | 0.02 | Emulgen 108 | 12.1 | 0.0050 |
| | | | CA | 0.1 | | | | | | |
| Example 18 | PL1 | 4.50 | Malonic acid | 0.3 | 1-Hydroxy-7-azabenzotriazole | −0.68 | 0.02 | Surfynol 465 | 16.0 | 0.0050 |
| | | | CA | 0.1 | | | | | | |

TABLE 1-continued

TABLE 1-1

| | Colloidal silica | | Organic acid | | Nitrogen-containing aromatic heterocyclic compound | | | Nonionic surfactant | | |
|---|---|---|---|---|---|---|---|---|---|---|
| | Type | Amount (%) | Type | Amount (%) | Type | ClogP | Amount (%) | Type | HLB | Amount (%) |
| Example 19 | PL1 | 4.50 | Malonic acid<br>CA | 0.3<br>0.1 | 1-HBTA | 0.69 | 0.02 | Rheodol 460 | 13.8 | 0.0050 |
| Example 20 | PL1 | 4.50 | Malonic acid<br>CA | 0.3<br>0.1 | 1-MHBTA | 0.54 | 0.02 | Emulgen 108 | 12.1 | 0.0050 |

TABLE 2

TABLE 1-1 (continued)

| | Anionic surfactant | | | | $H_2O_2$ | Organic solvent | | K | Na | |
|---|---|---|---|---|---|---|---|---|---|---|
| | Type | ClogP | Amount (%) | ΔClogP | Ratio | Amount (%) | Type | Amount (%) | Amount (ppt) | Amount (ppt) | K/Na |
| Example 1 | | | | | | 1.0 | ETG | 0.05 | 1.1E+10 | 51 | 2.1E+08 |
| Example 2 | | | | | | 1.0 | ETG | 0.05 | 1.0E+10 | 70 | 1.5E+08 |
| Example 3 | | | | | | 1.0 | ETG | 0.05 | 9.8E+09 | 51 | 1.9E+08 |
| Example 4 | | | | | | 1.0 | ETG | 0.05 | 9.4E+09 | 64 | 1.5E+08 |
| Example 5 | | | | | | 1.0 | ETG | 0.05 | 7.8E+09 | 67 | 1.2E+08 |
| Example 6 | | | | | | 1.0 | ETG | 0.05 | 9.4E+09 | 64 | 1.5E+08 |
| Example 7 | | | | | | 1.0 | ETG | 0.05 | 9.8E+09 | 66 | 1.5E+08 |
| Example 8 | | | | | | 1.0 | ETG | 0.05 | 9.4E+09 | 52 | 1.8E+08 |
| Example 9 | | | | | | 1.0 | ETG | 0.05 | 7.8E+09 | 46 | 1.7E+08 |
| Example 10 | ECT-7 | 5.36 | 0.0020 | 4.67 | 0.1,000 | 1.0 | ETG | 0.05 | 7.0E+09 | 72 | 9.8E+07 |
| Example 11 | ECT-7 | 5.36 | 0.0020 | 4.82 | 0.1,000 | 1.0 | ETG | 0.05 | 9.4E+09 | 78 | 1.2E+08 |
| Example 12 | ECT-7 | 5.36 | 0.0020 | 5.82 | 0.1,000 | 1.0 | ETG | 0.05 | 9.4E+09 | 72 | 1.3E+08 |
| Example 13 | ECT-7 | 5.36 | 0.0020 | 6.66 | 0.1,000 | 1.0 | ETG | 0.05 | 1.0E+10 | 76 | 1.3E+08 |
| Example 14 | ECT-7 | 5.36 | 0.0020 | 5.24 | 0.1,000 | 1.0 | ETG | 0.05 | 9.8E+09 | 77 | 1.3E+08 |
| Example 15 | ECT-7 | 5.36 | 0.0020 | 5.22 | 0.1,000 | 1.0 | ETG | 0.05 | 9.4E+09 | 76 | 1.2E+08 |
| Example 16 | ECT-7 | 5.36 | 0.0020 | 4.49 | 0.1,000 | 1.0 | ETG | 0.05 | 9.4E+09 | 77 | 1.2E+08 |
| Example 17 | ECT-7 | 5.36 | 0.0020 | 6.74 | 0.1,000 | 1.0 | ETG | 0.05 | 9.4E+09 | 72 | 1.3E+08 |
| Example 18 | ECT-7 | 5.36 | 0.0020 | 6.04 | 0.1,000 | 1.0 | ETG | 0.05 | 1.0E+10 | 70 | 1.4E+08 |
| Example 19 | ECT-7 | 5.36 | 0.0020 | 4.67 | 0.1,000 | 1.0 | ETG | 0.05 | 1.6E+09 | 57 | 2.9E+07 |
| Example 20 | ECT-7 | 5.36 | 0.0020 | 4.82 | 0.1,000 | 1.0 | ETG | 0.05 | 1.6E+09 | 59 | 2.7E+07 |

TABLE 3

TABLE 1-1 (continued)

| | pH Adjuster | | | Erosion suppressing property | Scratch suppressing property | Reliability |
|---|---|---|---|---|---|---|
| | Amount | Amount | pH | | | |
| Example 1 | Adjusted | Balance | 10.0 | AA | AA | AA |
| Example 2 | Adjusted | Balance | 10.0 | A | A | A |
| Example 3 | Adjusted | Balance | 10.0 | AA | AA | AA |
| Example 4 | Adjusted | Balance | 10.0 | A | A | A |
| Example 5 | Adjusted | Balance | 10.0 | A | A | A |
| Example 6 | Adjusted | Balance | 10.0 | AA | AA | AA |
| Example 7 | Adjusted | Balance | 10.0 | AA | AA | AA |
| Example 8 | Adjusted | Balance | 10.0 | A | A | A |
| Example 9 | Adjusted | Balance | 10.0 | A | A | A |
| Example 10 | Adjusted | Balance | 10.0 | AAA | AAA | AAA |
| Example 11 | Adjusted | Balance | 10.0 | AA | AA | AA |
| Example 12 | Adjusted | Balance | 10.0 | AAA | AAA | AAA |
| Example 13 | Adjusted | Balance | 10.0 | AA | AA | AA |
| Example 14 | Adjusted | Balance | 10.0 | AA | AA | AA |

TABLE 3-continued

TABLE 1-1 (continued)

| | pH Adjuster | | | Erosion suppressing property | Scratch suppressing property | Reliability |
|---|---|---|---|---|---|---|
| | Amount | Amount | pH | | | |
| Example 15 | Adjusted | Balance | 10.0 | AAA | AAA | AAA |
| Example 16 | Adjusted | Balance | 10.0 | AAA | AA | AAA |
| Example 17 | Adjusted | Balance | 10.0 | AA | AA | AA |
| Example 18 | Adjusted | Balance | 10.0 | AA | AA | AA |
| Example 19 | Adjusted | Balance | 9.0 | AA | AA | AA |
| Example 20 | Adjusted | Balance | 9.0 | A | A | A |

TABLE 4

TABLE 1-2

| | Colloidal silica | | Organic acid | | Nitrogen-containing aromatic heterocyclic compound | | | Nonionic surfactant | | |
|---|---|---|---|---|---|---|---|---|---|---|
| | Type | Amount (%) | Type | Amount (%) | Type | ClogP | Amount (%) | Type | HLB | Amount (%) |
| Example 21 | PL1 | 4.50 | Malonic acid CA | 0.3 0.1 | 5-CXBTA | −0.46 | 0.02 | Surfynol 465 | 16.0 | 0.0050 |
| Example 22 | PL1 | 4.50 | Malonic acid CA | 0.3 0.1 | 1-M-5ATe | −1.3 | 0.02 | Emulgen 103 | 8.1 | 0.0050 |
| Example 23 | PL1 | 4.50 | Malonic acid CA | 0.3 0.1 | 1-M-5Ste | 0.12 | 0.02 | Amitet 320 | 12.1 | 0.0050 |
| Example 24 | PL1 | 4.50 | Malonic acid CA | 0.3 0.1 | Pentetrazole | 0.14 | 0.02 | Emulgen 103 | 8.1 | 0.0050 |
| Example 25 | PL1 | 4.50 | Malonic acid CA | 0.3 0.1 | 5-Nitrobenzotriazole | 0.87 | 0.02 | Emulgen 108 | 12.1 | 0.0050 |
| Example 26 | PL1 | 4.50 | Malonic acid CA | 0.3 0.1 | 4-Amino-1,2,4-triazole | −1.38 | 0.02 | Rheodol 430 | 10.8 | 0.0050 |
| Example 27 | PL1 | 4.50 | Malonic acid CA | 0.3 0.1 | 1-Hydroxy-7-azabenzotriazole | −0.68 | 0.02 | Emulgen 150 | 18.4 | 0.0050 |
| Example 28 | PL1 | 4.50 | Malonic acid CA | 0.3 0.1 | 1-HBTA | 0.69 | 0.02 | Emulgen 108 | 12.1 | 0.0050 |
| Example 29 | PL1 | 4.50 | Malonic acid CA | 0.3 0.1 | 1-MHBTA | 0.54 | 0.02 | Emulgen 108 | 12.1 | 0.0050 |
| Example 30 | PL1 | 4.50 | Malonic acid CA | 0.3 0.1 | 5-CXBTA | −0.46 | 0.02 | Emulgen 103 | 8.1 | 0.0050 |
| Example 31 | PL1 | 4.50 | Malonic acid CA | 0.3 0.1 | 1-M-5ATe | −1.3 | 0.02 | Emulgen 108 | 12.1 | 0.0050 |
| Example 32 | PL1 | 4.50 | Malonic acid CA | 0.3 0.1 | 1-M-5Ste | 0.12 | 0.02 | Emulgen 150 | 18.4 | 0.0050 |
| Example 33 | PL1 | 4.50 | Malonic acid CA | 0.3 0.1 | Pentetrazole | 0.14 | 0.02 | Emulgen 108 | 12.1 | 0.0050 |
| Example 34 | PL1 | 4.50 | Malonic acid CA | 0.3 0.1 | 5-Nitrobenzotriazole | 0.87 | 0.02 | Rheodol 460 | 13.8 | 0.0050 |
| Example 35 | PL1 | 4.50 | Malonic acid CA | 0.3 0.1 | 4-Amino-1,2,4-triazole | −1.38 | 0.02 | Emulgen 108 | 12.1 | 0.0050 |
| Example 36 | PL1 | 4.50 | Malonic acid CA | 0.3 0.1 | 1-Hydroxy-7-azabenzotriazole | −0.68 | 0.02 | Rheodol 430 | 10.8 | 0.0050 |
| Example 37 | PL1 | 4.50 | Malonic acid CA | 0.3 0.1 | 1-HBTA | 0.69 | 0.20 | Emulgen 108 | 12.1 | 0.0050 |
| Example 38 | PL1 | 4.50 | Malonic acid CA | 0.3 0.1 | 1-HBTA | 0.69 | 2.00 | Emulgen 150 | 18.4 | 0.0050 |
| Example 39 | PL1 | 4.50 | Malonic acid CA | 0.3 0.1 | 1-HBTA | 0.69 | 0.20 | Emulgen 108 | 12.1 | 0.0050 |
| Example 40 | PL1 | 4.50 | Malonic acid CA | 0.3 0.1 | 5-CXBTA | −1.3 | 0.20 | Emulgen 108 | 12.1 | 0.0050 |

TABLE 5

TABLE 1-2 (continued)

| | Anionic surfactant | | | | H₂O₂ | Organic solvent | | K | Na | |
|---|---|---|---|---|---|---|---|---|---|---|
| | Type | ClogP | Amount (%) | ΔClogP | Ratio | Amount (%) | Type | Amount (%) | Amount (ppt) | Amount (ppt) | K/Na |
| Example 21 | ECT-7 | 5.36 | 0.0020 | 5.82 | 0.1,000 | 1.0 | ETG | 0.05 | 1.3E+09 | 57 | 2.3E+07 |
| Example 22 | ECT-7 | 5.36 | 0.0020 | 6.66 | 0.1,000 | 1.0 | ETG | 0.05 | 1.6E+09 | 58 | 2.7E+07 |
| Example 23 | ECT-7 | 5.36 | 0.0020 | 5.24 | 0.1,000 | 1.0 | ETG | 0.05 | 1.6E+09 | 58 | 2.7E+07 |
| Example 24 | ECT-7 | 5.36 | 0.0020 | 5.22 | 0.1,000 | 1.0 | ETG | 0.05 | 1.6E+09 | 75 | 2.1E+07 |
| Example 25 | ECT-7 | 5.36 | 0.0020 | 4.49 | 0.1,000 | 1.0 | ETG | 0.05 | 1.3E+09 | 75 | 1.7E+07 |
| Example 26 | ECT-7 | 5.36 | 0.0020 | 6.74 | 0.1,000 | 1.0 | ETG | 0.05 | 1.2E+09 | 73 | 1.6E+07 |
| Example 27 | ECT-7 | 5.36 | 0.0020 | 6.04 | 0.1,000 | 1.0 | ETG | 0.05 | 1.6E+09 | 73 | 2.2E+07 |
| Example 28 | ECT-7 | 5.36 | 0.0020 | 4.67 | 0.1,000 | 1.0 | ETG | 0.05 | 1.6E+11 | 68 | 2.3E+09 |
| Example 29 | ECT-7 | 5.36 | 0.0020 | 4.82 | 0.1,000 | 1.0 | ETG | 0.05 | 1.7E+11 | 69 | 2.5E+09 |
| Example 30 | ECT-7 | 5.36 | 0.0020 | 5.82 | 0.1,000 | 1.0 | ETG | 0.05 | 1.6E+11 | 68 | 2.4E+09 |
| Example 31 | ECT-7 | 5.36 | 0.0020 | 6.66 | 0.1,000 | 1.0 | ETG | 0.05 | 1.6E+11 | 66 | 2.3E+09 |
| Example 32 | ECT-7 | 5.36 | 0.0020 | 5.24 | 0.1,000 | 1.0 | ETG | 0.05 | 1.3E+11 | 52 | 2.5E+09 |
| Example 33 | ECT-7 | 5.36 | 0.0020 | 5.22 | 0.1,000 | 1.0 | ETG | 0.05 | 1.6E+11 | 78 | 2.0E+09 |
| Example 34 | ECT-7 | 5.36 | 0.0020 | 4.49 | 0.1,000 | 1.0 | ETG | 0.05 | 1.6E+11 | 72 | 2.3E+09 |
| Example 35 | ECT-7 | 5.36 | 0.0020 | 6.74 | 0.1,000 | 1.0 | ETG | 0.05 | 1.6E+11 | 76 | 2.1E+09 |
| Example 36 | ECT-7 | 5.36 | 0.0020 | 6.04 | 0.1,000 | 1.0 | ETG | 0.05 | 1.3E+11 | 77 | 1.7E+09 |
| Example 37 | ECT-7 | 5.36 | 0.0020 | 4.67 | 0.0100 | 1.0 | ETG | 0.05 | 7.0E+09 | 80 | 8.8E+07 |
| Example 38 | ECT-7 | 5.36 | 0.0008 | 4.67 | 0.0004 | 1.0 | ETG | 0.05 | 9.4E+09 | 72 | 1.3E+08 |
| Example 39 | ECT-7 | 5.36 | 0.0001 | 4.67 | 0.0005 | 1.0 | ETG | 0.05 | 1.0E+10 | 76 | 1.3E+08 |
| Example 40 | ECT-7 | 5.36 | 0.0020 | 6.66 | 0.0100 | 1.0 | ETG | 0.05 | 9.8E+09 | 77 | 1.3E+08 |

TABLE 6

TABLE 1-2 (continued)

| | pH Adjuster Amount | Water Amount | pH | Erosion suppressing property | Scratch suppressing property | Reliability |
|---|---|---|---|---|---|---|
| Example 21 | Adjusted | Balance | 9.0 | AA | AA | AA |
| Example 22 | Adjusted | Balance | 9.0 | A | A | A |
| Example 23 | Adjusted | Balance | 9.0 | A | A | A |
| Example 24 | Adjusted | Balance | 9.0 | AA | AA | AA |
| Example 25 | Adjusted | Balance | 9.0 | AA | AA | AA |
| Example 26 | Adjusted | Balance | 9.0 | A | A | A |
| Example 27 | Adjusted | Balance | 9.0 | A | A | A |
| Example 28 | Adjusted | Balance | 12.0 | AA | AA | AA |
| Example 29 | Adjusted | Balance | 12.0 | A | A | A |
| Example 30 | Adjusted | Balance | 12.0 | AA | AA | AA |
| Example 31 | Adjusted | Balance | 12.0 | A | A | A |
| Example 32 | Adjusted | Balance | 12.0 | A | A | A |
| Example 33 | Adjusted | Balance | 12.0 | AA | AA | AA |
| Example 34 | Adjusted | Balance | 12.0 | AA | AA | AA |
| Example 35 | Adjusted | Balance | 12.0 | A | A | A |
| Example 36 | Adjusted | Balance | 12.0 | A | A | A |
| Example 37 | Adjusted | Balance | 10.0 | AA | AA | AA |
| Example 38 | Adjusted | Balance | 10.0 | A | AA | AA |
| Example 39 | Adjusted | Balance | 10.0 | AA | AA | AA |
| Example 40 | Adjusted | Balance | 10.0 | AA | AA | AA |

TABLE 7

TABLE 1-3

| | Colloidal silica | | Organic acid | | Nitrogen-containing aromatic heterocyclic compound | | | Nonionic surfactant | | |
|---|---|---|---|---|---|---|---|---|---|---|
| | Type | Amount (%) | Type | Amount (%) | Type | ClogP | Amount (%) | Type | HLB | Amount (%) |
| Example 41 | PL1 | 4.50 | Malonic acid | 0.3 | 5-CXBTA | −1.3 | 2.00 | Emulgen 108 | 12.1 | 0.0050 |
| | | | CA | 0.1 | | | | | | |
| Example 42 | PL1 | 4.50 | Malonic acid | 0.3 | 5-CXBTA | −1.3 | 0.20 | Emulgen 103 | 8.1 | 0.0050 |
| | | | CA | 0.1 | | | | | | |
| Example 43 | PL1 | 4.50 | Malonic acid | 0.3 | 1H-Tetrazole-1-acetic acid | −0.95 | 0.20 | Surfynol 465 | 16.0 | 0.0050 |
| | | | CA | 0.1 | | | | | | |

TABLE 7-continued

TABLE 1-3

| | Colloidal silica | | Organic acid | | Nitrogen-containing aromatic heterocyclic compound | | | Nonionic surfactant | | |
|---|---|---|---|---|---|---|---|---|---|---|
| | Type | Amount (%) | Type | Amount (%) | Type | ClogP | Amount (%) | Type | HLB | Amount (%) |
| Example 44 | PL1 | 4.50 | Malonic acid CA | 0.3 0.1 | 1H-Tetrazole-1-acetic acid | −0.95 | 2.00 | Emulgen 150 | 18.4 | 0.0050 |
| Example 45 | PL1 | 4.50 | Malonic acid CA | 0.3 0.1 | 1H-Tetrazole-1-acetic acid | −0.95 | 0.20 | Rheodol 460 | 13.8 | 0.0050 |
| Example 46 | PL1 | 4.50 | Malonic acid CA | 0.3 0.1 | Pentetrazole | 0.14 | 0.20 | Rheodol 430 | 10.8 | 0.0050 |
| Example 47 | PL1 | 4.50 | Malonic acid CA | 0.3 0.1 | Pentetrazole | 0.14 | 2.00 | Emulgen 108 | 12.1 | 0.0050 |
| Example 48 | PL1 | 4.50 | Malonic acid CA | 0.3 0.1 | Pentetrazole | 0.14 | 0.20 | Emulgen 150 | 18.4 | 0.0050 |
| Example 49 | PL1 | 4.50 | Malonic acid CA | 0.3 0.1 | 5-Nitrobenzotriazole | 0.87 | 0.20 | Emulgen 108 | 12.1 | 0.0050 |
| Example 50 | PL1 | 4.50 | Malonic acid CA | 0.3 0.1 | 5-Nitrobenzotriazole | 0.87 | 2.00 | Emulgen 150 | 18.4 | 0.0050 |
| Example 51 | PL1 | 4.50 | Malonic acid CA | 0.3 0.1 | 5-Nitrobenzotriazole | 0.87 | 0.20 | Emulgen 108 | 12.1 | 0.0050 |
| Comparative Example 1 | PL1 | 4.50 | Malonic acid CA | 0.3 0.1 | BTA | 1.34 | 0.02 | Emulgen 108 | 12.1 | 0.0050 |
| Comparative Example 2 | PL1 | 4.50 | Malonic acid CA | 0.3 0.1 | 5-Aminotetrazole | −1.42 | 0.02 | Rheodol 430 | 10.8 | 0.0050 |
| Comparative Example 3 | PL1 | 4.50 | Malonic acid CA | 0.3 0.1 | Pentetrazole | 0.14 | 0.02 | Emulgen 108 | 12.1 | 0.0050 |
| Comparative Example 4 | PL1 | 4.50 | Malonic acid CA | 0.3 0.1 | 5-Nitrobenzotriazole | 0.87 | 0.02 | Rheodol 460 | 13.8 | 0.0050 |
| Comparative Example 5 | PL1 | 4.50 | Malonic acid CA | 0.3 0.1 | Pentetrazole | 0.14 | 0.02 | Surfynol 465 | 16.0 | 0.0050 |
| Comparative Example 6 | PL1 | 4.50 | Malonic acid CA | 0.3 0.1 | 5-Nitrobenzotriazole | 0.87 | 0.02 | Emulgen 103 | 8.1 | 0.0050 |

TABLE 8

TABLE 1-3 (continued)

| | Anionic surfactant | | | | | $H_2O_2$ | Organic solvent | | K | Na | |
|---|---|---|---|---|---|---|---|---|---|---|---|
| | Type | ClogP | Amount (%) | ΔClogP | Ratio | Amount (%) | Type | Amount (%) | Amount (ppt) | Amount (ppt) | K/Na |
| Example 41 | ECT-7 | 5.36 | 0.0008 | 6.66 | 0.0004 | 1.0 | ETG | 0.05 | 9.4E+09 | 72 | 1.3E+08 |
| Example 42 | ECT-7 | 5.36 | 0.0001 | 6.66 | 0.0005 | 1.0 | ETG | 0.05 | 7.8E+09 | 70 | 1.1E+08 |
| Example 43 | ECT-7 | 5.36 | 0.0020 | 6.31 | 0.0100 | 1.0 | ETG | 0.05 | 9.4E+09 | 56 | 1.7E+08 |
| Example 44 | ECT-7 | 5.36 | 0.0008 | 6.31 | 0.0004 | 1.0 | ETG | 0.05 | 9.4E+09 | 59 | 1.6E+08 |
| Example 45 | ECT-7 | 5.36 | 0.0001 | 6.31 | 0.0005 | 1.0 | ETG | 0.05 | 9.4E+09 | 57 | 1.7E+08 |
| Example 46 | ECT-7 | 5.36 | 0.0020 | 5.22 | 0.0100 | 1.0 | ETG | 0.05 | 9.8E+09 | 58 | 1.7E+08 |
| Example 47 | ECT-7 | 5.36 | 0.0008 | 5.22 | 0.0004 | 1.0 | ETG | 0.05 | 9.4E+09 | 58 | 1.6E+08 |
| Example 48 | ECT-7 | 5.36 | 0.0001 | 5.22 | 0.0005 | 1.0 | ETG | 0.05 | 7.0E+09 | 76 | 9.3E+07 |
| Example 49 | ECT-7 | 5.36 | 0.0020 | 4.49 | 0.0100 | 1.0 | ETG | 0.05 | 9.4E+09 | 73 | 1.3E+08 |
| Example 50 | ECT-7 | 5.36 | 0.0008 | 4.49 | 0.0004 | 1.0 | ETG | 0.05 | 1.0E+10 | 75 | 1.4E+08 |
| Example 51 | ECT-7 | 5.36 | 0.0001 | 4.49 | 0.0005 | 1.0 | ETG | 0.05 | 9.8E+09 | 75 | 1.3E+08 |
| Comparative Example 1 | ECT-7 | 5.36 | 0.0001 | 4.02 | 0.0050 | 1.0 | ETG | 0.05 | 9.4E+09 | 73 | 1.3E+08 |
| Comparative Example 2 | ECT-7 | 5.36 | 0.0001 | 6.78 | 0.0050 | 1.0 | ETG | 0.05 | 9.4E+09 | 73 | 1.3E+08 |
| Comparative Example 3 | ECT-7 | 5.36 | 0.0020 | 5.22 | 0.1,000 | 1.0 | ETG | 0.05 | 9.4E+09 | 76 | 1.2E+08 |
| Comparative Example 4 | ECT-7 | 5.36 | 0.0020 | 4.49 | 0.1,000 | 1.0 | ETG | 0.05 | 9.4E+09 | 77 | 1.2E+08 |
| Comparative Example 5 | ECT-7 | 5.36 | 0.0020 | 5.22 | 0.1,000 | 1.0 | ETG | 0.05 | 9.4E+10 | 76 | 1.2E+09 |
| Comparative Example 6 | ECT-7 | 5.36 | 0.0020 | 4.49 | 0.1,000 | 1.0 | ETG | 0.05 | 9.4E+10 | 77 | 1.2E+09 |

TABLE 9

TABLE 1-3 (continued)

| | pH Adjuster Amount | Water Amount | pH | Erosion suppressing property | Scratch suppressing property | Reliability |
|---|---|---|---|---|---|---|
| Example 41 | Adjusted | Balance | 10.0 | AA | AA | AA |
| Example 41 | Adjusted | Balance | 10.0 | AA | AA | AA |
| Example 42 | Adjusted | Balance | 10.0 | AA | AA | AA |
| Example 43 | Adjusted | Balance | 10.0 | AA | AA | AA |
| Example 44 | Adjusted | Balance | 10.0 | A | AA | AA |
| Example 45 | Adjusted | Balance | 10.0 | AA | AA | AA |
| Example 46 | Adjusted | Balance | 10.0 | AA | AA | AA |
| Example 47 | Adjusted | Balance | 10.0 | AA | AA | AA |
| Example 48 | Adjusted | Balance | 10.0 | A | AA | AA |
| Example 49 | Adjusted | Balance | 10.0 | AA | AA | AA |
| Example 50 | Adjusted | Balance | 10.0 | A | AA | AA |
| Example 51 | Adjusted | Balance | 10.0 | AA | AA | AA |
| Comparative Example 1 | Adjusted | Balance | 10.0 | A | D | AA |
| Comparative Example 2 | Adjusted | Balance | 10.0 | A | D | AA |
| Comparative Example 3 | Adjusted | Balance | 8.0 | D | A | AAA |
| Comparative Example 4 | Adjusted | Balance | 8.0 | D | A | AAA |
| Comparative Example 5 | Adjusted | Balance | 12.5 | A | D | A |
| Comparative Example 6 | Adjusted | Balance | 12.5 | A | D | A |

From the results shown in the tables, it was confirmed that desired results could be obtained in a case of using the present polishing liquid.

It was confirmed that in a case where the present polishing liquid includes 1-hydroxybenzotriazole, 5-carboxybenzotriazole, pentetrazole, or 5-nitrobenzotriazole as the specific compound, the erosion suppressing property, the scratch suppressing property, and the reliability are more excellent, as compared with cases where other specific compounds are included (see the comparison of the results of Examples 1 to 9, and the like).

It was confirmed that in a case where the present polishing liquid includes an anionic surfactant, the erosion suppressing property, the scratch suppressing property, and the reliability are more excellent (see the comparison of the results of Examples 1 to 18, and the like).

It was confirmed that in a case where the present polishing liquid includes a nonionic surfactant having an HLB of 7 or more, the scratch suppressing property is more excellent, as compared with a case where the present polishing liquid includes a nonionic surfactant having an HLB of less than 7 (see the comparison of the results of Examples 10, 12, 15, and 16, and the like).

In addition, it was confirmed that in a case where the present polishing liquid includes a nonionic surfactant having an HLB of 17 or less, the erosion suppressing property is more excellent, as compared with a case where the present polishing liquid includes a nonionic surfactant having an HLB of more than 17 (see the comparison of the results of Examples 10, 12, 15, and 16, and the like).

It was confirmed that in a case where a pH of the present polishing liquid is more than 9.0 and less than 12.0, the erosion suppressing property, the scratch suppressing property, and the reliability are more excellent (see the comparison of the results of Examples 10 to 36, and the like).

Any of the corrosion potentials measured using the polishing liquids of the respective Examples were in the range of −0.2 to 0.5 V.

In addition, a pH adjuster was added in order to lower the pH of the polishing liquid of Example 1, and the corrosion potential was adjusted to 0.51 V or more in the range of pH 8 or more.

In a case where the evaluation was carried out in the same manner as in Example 1 using the polishing liquid, the same results as in Example 1, except that the "erosion suppressing property" was B, were obtained.

Example B

Further, the following tests were performed while changing a polishing pressure (a contact pressure for contacting the surface to be polished and the polishing pad), using the polishing liquid of each of Examples 12, 14, 18, and 19 described above.

[Tests]
<Evaluation of Scratch Suppressing Property—2>

Evaluation of the scratch suppressing property was performed in the same manner as in <Evaluation of Scratch Suppressing Property—1> described above, except that the polishing pressure was set to the polishing pressure shown in Table 2 below.

<Evaluation of Uniformity—1>

A polished wafer was obtained according to the method described in <Evaluation of Erosion Suppressing Property> described above, except that the polishing pressure was set to the polishing pressure shown in Table 2 below.

For the wafer after polishing, a level difference of each of a chip formed in the vicinity of the center of the polished surface and a chip formed in the vicinity of the edge of the polished surface was measured, and a difference between the level difference measured in the vicinity of the center and the level difference in the vicinity of the edge was classified according to the following categories.

Furthermore, the level difference as mentioned herein is a total value of the erosion value (height difference between the reference surface and the central portion of the space part) and the dishing value (height difference between the reference surface and the central portion of the line part). In addition, dishing is a phenomenon in which a surface of a wiring line exposed to a surface to be polished has a dish-shaped indentation by polishing in a case where the wiring line is formed by CMP.

It can be evaluated that the smaller the level differences is, the better the uniformity is.

AAA: The level difference is less than 3 nm
AA: The level difference is 3 nm or more and less than 5 nm
A: The level difference is 5 nm or more and less than 8 nm
B: The level difference is 8 nm or more and less than 10 nm
C: The level difference is 10 nm or more The evaluation results of the tests performed while changing the contact pressure are shown below.

TABLE 10

Table 2

| | | Polishing pressure (psi) | | | | | |
|---|---|---|---|---|---|---|---|
| | | 0.25 | 0.5 | 1 | 2 | 3 | 3.5 |
| Example 12 | Scratch suppressing property | AA | AAA | AAA | AAA | AAA | B |
| | Uniformity | C | AA | AAA | AAA | AAA | B |

TABLE 10-continued

Table 2

| | | Polishing pressure (psi) | | | | | |
|---|---|---|---|---|---|---|---|
| | | 0.25 | 0.5 | 1 | 2 | 3 | 3.5 |
| Example 14 | Scratch suppressing property | A | AA | AA | AA | AA | C |
| | Uniformity | C | AA | AAA | AAA | AAA | B |
| Example 18 | Scratch suppressing property | A | AA | AA | AA | AA | C |
| | Uniformity | C | AA | AAA | AAA | AAA | B |
| Example 19 | Scratch suppressing property | A | AA | AA | AA | AA | C |
| | Uniformity | C | AA | AAA | AAA | AAA | B |

As shown in the table, it was confirmed that the polishing pressure is preferably 0.5 to 3.0 psi, and more preferably 1.0 to 3.0 psi.

Example C

Further, the following tests were performed while changing the supply rate of the polishing liquid, using the polishing liquid of each of Examples 12, 14, 18, and 19 described above.

[Tests]

<Evaluation of Scratch Suppressing Property—3>

Evaluation of the scratch suppressing property was performed in the same manner as in <Evaluation of Scratch Suppressing Property—2>, except that the supply rate of the polishing liquid was changed as shown in the table below and the polishing pressure was fixed at 2.0 psi.

<Evaluation of Uniformity—2>

In addition, evaluation of the uniformity was performed in the same manner as in <Evaluation of Uniformity—1>, except that the supply rate of the polishing liquid was changed as shown in a table below and the polishing pressure was fixed at 2.0 psi.

The evaluation results of the tests performed while changing the supply rate of the polishing liquid are shown below.

TABLE 11

Table 3

| | | Supply rate (ml/(min · cm$^2$)) of polishing liquid | | | | | |
|---|---|---|---|---|---|---|---|
| | | 0.1 | 0.14 | 0.21 | 0.28 | 0.35 | 0.4 |
| Example 12 | Scratch suppressing property | B | AAA | AAA | AAA | AAA | AA |
| | Uniformity | B | AA | AAA | AAA | AAA | C |
| Example 14 | Scratch suppressing property | C | AA | AA | AA | AA | A |
| | Uniformity | B | AA | AAA | AAA | AAA | C |
| Example 18 | Scratch suppressing property | C | AA | AA | AA | AA | A |
| | Uniformity | B | AA | AAA | AAA | AAA | C |
| Example 19 | Scratch suppressing property | C | AA | AA | AA | AA | A |
| | Uniformity | B | AA | AAA | AAA | AAA | C |

As shown in the table, it was confirmed that the supply rate of the polishing liquid is preferably 0.14 to 0.35 ml/(min·cm$^2$), and more preferably 0.21 to 0.35 ml/(min·cm$^2$).

Example D

Further, the following tests were performed while changing the type of the cleaning liquid (pCMP liquid), using the polishing liquid of each of Examples 12, 14, 18, and 19 described above.

[Tests]

<Evaluation of Residue Suppressing Property>

A wafer was treated in the same manner as in <Evaluation of Scratch Suppressing Property—2>, except that the polishing pressure was fixed at 2.0 psi and the type of the cleaning liquid to be used was changed as shown in the table below.

The obtained wafer was measured by a defect detection device, the coordinates where defects having a major diameter of 0.06 µm or less were present were identified, and then the types of the defects at the identified coordinates were classified. The number of residues (residue-based defects) detected on the wafer was classified according to the following categories.

It can be evaluated that the smaller the number of the residues is, the more excellent the residue suppressing property is.

AAA: The number of the residues is less than 200

AA: The number of the residues is 200 or more and less than 350

A: The number of the residues is 350 or more and less than 500

B: The number of the residues is 500 or more and less than 750

C: The number of the residues is 750 or more and less than 1,000

D: The number of the residues is 1,000 or more

<Evaluation of Corrosion Suppressing Property>

A wafer was treated in the same manner as in the above-mentioned <Evaluation of Residue Suppressing Property>.

The surface roughness (Ra) on the Co wiring line (wiring line with a width of 100 µm) exposed on a surface in the surface to be polished in the obtained wafer was measured with an atomic force microscope (AFM) at N=3, and average Ra's were classified according to the following categories.

It can be evaluated that the smaller Ra is, the more excellent the corrosion suppressing property is.

AAA: Ra of the measured area of 5 µm is less than 1.0 nm

AA: Ra of the measured area of 5 µm is 1.0 nm or more and less than 1.5 nm

A: Ra of the measured area of 5 µm is 1.5 nm or more and less than 2.0 nm

B: Ra of the measured area of 5 µm is 2.0 nm or more and less than 2.5 nm

C: Ra of the measured area of 5 µm is 2.5 nm or more and less than 3.0 nm

D: Ra of the measured area of 5 µm is 3.0 nm or more

The evaluation results of the tests performed while changing the type of the cleaning liquid are shown below.

TABLE 12

Table 4

|  |  | Cleaning liquid | | |
|---|---|---|---|---|
|  |  | DIW | Acidic | Alkaline |
| Example 12 | Residue suppressing property | C | B | AAA |
|  | Corrosion suppressing property | AAA | C | AAA |
| Example 14 | Residue suppressing property | C | B | AAA |
|  | Corrosion suppressing property | AAA | C | AAA |
| Example 18 | Residue suppressing property | C | B | AAA |
|  | Corrosion suppressing property | AAA | C | AAA |
| Example 19 | Residue suppressing property | C | B | AAA |
|  | Corrosion suppressing property | AAA | C | AAA |

DIW: Water

DIW: Water

Acidic: CLEAN100 (manufactured by Fujifilm Electronics Materials Co., Ltd.: acidic cleaning liquid)

Alkaline: CL9010 (manufactured by Fujifilm Electronics Materials Co., Ltd.: alkaline cleaning liquid)

As shown in the table, it was confirmed that the alkaline cleaning liquid is preferable as the cleaning liquid.

Example E

Further, the following tests were performed while changing the type of the object to be polished, using the polishing liquid of each of Examples 12, 14, 18, and 19 described above.

[Tests]

<Evaluation of Polishing Speed (RR)>

A wafer having a film consisting of Co, TiN, Ta, SiN, TEOS, SiOC, or SiC on the surface was polished under the conditions that a polishing pressure was set to 2.0 psi and a supply rate of the polishing liquid was set to 0.28 ml/(min·cm$^2$), using FREX300SII (polishing device).

The film thickness before and after polishing was measured with a polishing time of 1 minute, a polishing speed RR (nm/min) was calculated from a difference in the film thickness, and the polishing speed was evaluated with respect to each material according to the following categories.

(Case where the Film is TiN, Ta, TEOS, or SiOC)
- A: RR is 50 nm/min or more
- B: RR is less than 50 nm/min (Case where the Film is Co, SiN, or SiC)
- A: RR is 20 nm/min or more
- B: RR is less than 20 nm/min The evaluation results are shown below.

A speed ratio of the polishing speed of Co to the polishing speed of TiN, Ta, SiN, TEOS, SiOC, or SiC (polishing speed of Co/polishing speed of TiN, Ta, SiN, TEOS, SiOC, or SiC) was in the range of more than 0.05 and less than 5.

TABLE 13

TABLE 5

| | Object to be polished | | | | | | |
|---|---|---|---|---|---|---|---|
| | Co | TiN | Ta | SiN | TEOS | SiOC | SiC |
| Example 12 | A | A | A | A | A | A | A |
| Example 14 | A | A | A | A | A | A | A |
| Example 18 | A | A | A | A | A | A | A |
| Example 19 | A | A | A | A | A | A | A |

As shown in the results, it was confirmed that the polishing liquid of the embodiment of the present invention has no extreme speed difference between the polishing speed for Co and the polishing speed for TiN, Ta, SiN, TEOS, SiOC, or SiC, and is suitable as a polishing liquid used for removing the barrier layer and the like.

Furthermore, in the polishing liquid of the embodiment of the present invention, the polishing speed with respect to Co can be optionally adjusted (adjusted to, for example, between 0 and 30 nm/min) by adjusting the content of hydrogen peroxide in the polishing liquid.

EXPLANATION OF REFERENCES

10$a$ object to be pretreated
10$b$ object to be polished
10$c$ object to be polished, which has been polished
12 cobalt-containing film
14 barrier layer
16 interlayer insulating layer
18 bulk layer

What is claimed is:

1. A polishing liquid used for chemical mechanical polishing of an object to be polished having a cobalt-containing film, the polishing liquid comprising:
   colloidal silica;
   an organic acid;
   a nitrogen-containing aromatic heterocyclic compound which is one or more selected from the group consisting of a compound represented by General Formula (I), a compound represented by General Formula (II), a compound represented by General Formula (III), a compound represented by General Formula (IV), and a compound represented by General Formula (V), and has a ClogP value of less than 1.0; and
   hydrogen peroxide,
   wherein a pH is 8.5 to 12.0,

(I)

in General Formula (I), $R^{11}$ and $R^{12}$ each independently represent a hydrogen atom, a hydrophilic group, or a hydrocarbon group having a hydrophilic group, and $R^{11}$ and $R^{12}$ may be bonded to each other to form a ring,

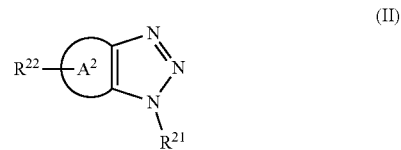

(II)

in General Formula (II), a ring $A^2$ represents a benzene ring or a 6-membered aromatic heterocycle, $R^{21}$ represents a hydrophilic group or a hydrocarbon group having a hydrophilic group, and $R^{22}$ represents a hydrogen atom, a hydrophilic group, or a hydrocarbon group having a hydrophilic group,

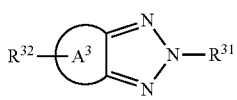

in General Formula (III), a ring $A^3$ represents a benzene ring or a 6-membered aromatic heterocycle, $R^{31}$ represents a hydrophilic group or a hydrocarbon group having a hydrophilic group, and $R^{32}$ represents a hydrogen atom, a hydrophilic group, or a hydrocarbon group having a hydrophilic group,

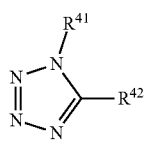

in General Formula (IV), $R^{41}$ represents a substituent, $R^{42}$ represents a hydrogen atom, a hydrophilic group, or a hydrocarbon group having a hydrophilic group, and $R^{41}$ and $R^{42}$ may be bonded to each other to form a ring,

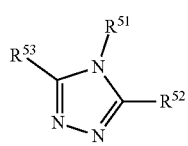

in General Formula (V), $R^{51}$, $R^{52}$, and $R^{53}$ each independently represent a hydrogen atom, a hydrophilic group, or a hydrocarbon group having a hydrophilic group, and $R^{51}$ and $R^{52}$ may be bonded to each other to form a ring, and $R^{51}$ and $R^{53}$ may be bonded to each other to form a ring, the polishing liquid further comprises sodium and potassium, wherein a mass ratio of a content of potassium to a content of sodium is $1.0\times10^6$ to $1.0\times10^{12}$.

2. The polishing liquid according to claim 1,
wherein a pH of the polishing liquid is more than 9.0 and less than 12.0.

3. The polishing liquid according to claim 2, further comprising a surfactant.

4. The polishing liquid according to claim 3,
wherein the surfactant includes an anionic surfactant.

5. The polishing liquid according to claim 1, further comprising a surfactant.

6. The polishing liquid according to claim 5,
wherein the surfactant includes an anionic surfactant.

7. The polishing liquid according to claim 6,
wherein a value of a difference obtained by subtracting a ClogP value of the nitrogen-containing aromatic heterocyclic compound from a ClogP value of the anionic surfactant is more than 4.0.

8. The polishing liquid according to claim 5,
wherein the surfactant includes a nonionic surfactant.

9. The polishing liquid according to claim 5,
wherein the surfactant includes a nonionic surfactant having a hydrophilic-lipophilic balance (HLB) value of 8 to 17.

10. The polishing liquid according to claim 1,
wherein the organic acid is polycarboxylic acid.

11. The polishing liquid according to claim 1,
wherein a content of the colloidal silica is 20.0% by mass or less with respect to a total mass of the polishing liquid, and
an average primary particle diameter of the colloidal silica is 60 nm or less.

12. The polishing liquid according to claim 1,
wherein a concentration of solid contents is 10% by mass or more, and
the polishing liquid is used after 2-times or more dilution on a mass basis.

13. The polishing liquid according to claim 1, further comprising a surfactant, wherein the surfactant includes an anionic surfactant and a nonionic surfactant, and
a mass ratio of a content of the anionic surfactant to a content of the nonionic surfactant is 0.001 to 1,000.

14. A chemical mechanical polishing method comprising:
a step of obtaining an object to be polished, which has been polished, by bringing a surface to be polished of an object to be polished into contact with a polishing pad attached to a polishing platen while supplying the polishing liquid according to claim 1 to the polishing pad, and relatively moving the object to be polished and the polishing pad to polish the surface to be polished.

15. The chemical mechanical polishing method according to claim 14,
wherein a polishing pressure is 0.5 to 3.0 psi.

16. The chemical mechanical polishing method according to claim 14,
wherein a supply rate of the polishing liquid supplied to the polishing pad is 0.14 to 0.35 ml/(min·cm$^2$).

17. The chemical mechanical polishing method according to claim 14,
wherein the object to be polished has at least a first layer containing cobalt and a second layer other than the first layer, and
a polishing speed of the first layer is more than 0.05 and less than 5 with respect to a polishing speed of the second layer under the same polishing conditions.

18. The chemical mechanical polishing method according to claim 17,
wherein the second layer includes one or more materials selected from the group consisting of tantalum, tantalum nitride, titanium nitride, silicon nitride, tetraethoxysilane, silicon oxycarbide, and silicon carbide.

19. The chemical mechanical polishing method according to claim 14, further comprising a step of cleaning the object to be polished, which has been polished, with an alkaline cleaning liquid after the step of obtaining the object to be polished, which has been polished.

20. A polishing liquid used for chemical mechanical polishing of an object to be polished, the polishing liquid comprising:
abrasive grains;
an organic acid;
a nitrogen-containing aromatic heterocyclic compound which is one or more selected from the group consisting of a compound represented by General Formula (I), a compound represented by General Formula (II), a compound represented by General Formula (III), a compound represented by General Formula (IV), and a compound represented by General Formula (V), and has a ClogP value of less than 1.0; and
hydrogen peroxide,
wherein a pH is 8.5 to 12.0,

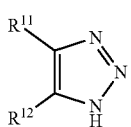
(I)

in General Formula (I), $R^{11}$ and $R^{12}$ each independently represent a hydrogen atom, a hydrophilic group, or a hydrocarbon group having a hydrophilic group, and $R^{11}$ and $R^{12}$ may be bonded to each other to form a ring,

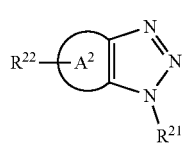
(II)

in General Formula (II), a ring $A^2$ represents a benzene ring or a 6-membered aromatic heterocycle, $R^{21}$ represents a hydrophilic group or a hydrocarbon group having a hydrophilic group, and $R^{22}$ represents a hydrogen atom, a hydrophilic group, or a hydrocarbon group having a hydrophilic group,

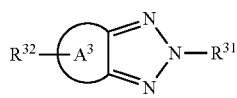
(III)

in General Formula (III), a ring $A^3$ represents a benzene ring or a 6-membered aromatic heterocycle, $R^{31}$ represents a hydrophilic group or a hydrocarbon group having a hydrophilic group, and $R^{32}$ represents a hydrogen atom, a hydrophilic group, or a hydrocarbon group having a hydrophilic group,

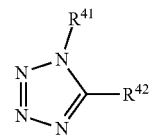
(IV)

in General Formula (IV), $R^{41}$ represents a substituent, $R^{42}$ represents a hydrogen atom, a hydrophilic group, or a hydrocarbon group having a hydrophilic group, and $R^{41}$ and $R^{42}$ may be bonded to each other to form a ring,

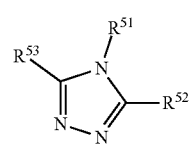
(V)

in General Formula (V), $R^{51}$, $R^{52}$, and $R^{53}$ each independently represent a hydrogen atom, a hydrophilic group, or a hydrocarbon group having a hydrophilic group, and $R^{51}$ and $R^{52}$ may be bonded to each other to form a ring, and $R^{51}$ and $R^{53}$ may be bonded to each other to form a ring,
the polishing liquid further comprises sodium and potassium,
wherein a mass ratio of a content of potassium to a content of sodium is $1.0 \times 10^6$ to $1.0 \times 10^{12}$.

21. The polishing liquid according to claim 20, further comprising a surfactant, wherein the surfactant includes an anionic surfactant and a nonionic surfactant, and
a mass ratio of a content of the anionic surfactant to a content of the nonionic surfactant is 0.001 to 1,000.

\* \* \* \* \*